(12) United States Patent
Matsuura

(10) Patent No.: US 8,487,799 B1
(45) Date of Patent: Jul. 16, 2013

(54) CALIBRATION FOR RFDAC

(75) Inventor: Toru Matsuura, Kanagawa (JP)

(73) Assignee: Panasonic Corporation, Osaka (JP)

(\*) Notice: Subject to any disclaimer, the term of this patent is extended or adjusted under 35 U.S.C. 154(b) by 16 days.

(21) Appl. No.: 13/418,070

(22) Filed: Mar. 12, 2012

(51) Int. Cl.
*H03M 1/66* (2006.01)

(52) U.S. Cl.
USPC .......................... 341/144; 341/145; 375/146

(58) Field of Classification Search
USPC .................. 375/146, 295, 296; 341/144, 145
See application file for complete search history.

(56) References Cited

U.S. PATENT DOCUMENTS 6,442,192 B1 \* 8/2002 Senda ........................... 375/146
8,036,285 B2 \* 10/2011 Awad ........................... 375/260

\* cited by examiner

*Primary Examiner* — Jean B Jeanglaude

(57) ABSTRACT

The RFDAC includes: a multi-phase radio-frequency signal generator configured to generate radio-frequency signals that are different in phase; a vector selector configured to select two radio-frequency signals therefrom, cause each of the two radio-frequency signals to pass through at least one transmission path, combine the two radio-frequency signals; a test signal generator configured to output a test signal; a multiplexer configured to select either the test signal or the baseband signal; a vector controller configured to control the vector selector based on the selected signal and a predetermined selection pattern such that the two radio-frequency signals, and transmission paths thereof are selected; a detector configured to detect an output signal from the vector selector; and a calibrator configured to calibrate a phase error between the selected two radio-frequency signals, based on an envelope of the output signal.

16 Claims, 34 Drawing Sheets

| Time [samples] | 1 | 2 | 3 | 4 | 5 | 6 | 7 | ... |
|---|---|---|---|---|---|---|---|---|
| Phase of group a [rad] | 0 | $\pi/2$ | $\pi$ | $-\pi/2$ | 0 | $\pi/2$ | $\pi$ | ... |
| Phase of group b [rad] | $\pi/2$ | $\pi$ | $-\pi/2$ | 0 | $\pi/2$ | $\pi$ | $-\pi/2$ | ... |

(b)

| Time [samples] | 1 | 2 | 3 | 4 | 5 | 6 | 7 | ... |
|---|---|---|---|---|---|---|---|---|
| Phase of group a [rad] | 0 | $\pi$ | $\pi$ | 0 | 0 | $\pi$ | $\pi$ | ... |
| Phase of group b [rad] | $\pi/2$ | $\pi/2$ | $-\pi/2$ | $-\pi/2$ | $\pi/2$ | $\pi/2$ | $-\pi/2$ | ... |

(c)

| Time [samples] | 1 | 2 | 3 | 4 | 5 | 6 | 7 | ... |
|---|---|---|---|---|---|---|---|---|
| Phase of group a [rad] | 0 | $\pi/2$ | 0 | $\pi/2$ | 0 | $\pi/2$ | 0 | ... |
| Phase of group b [rad] | $\pi/2$ | $\pi$ | $\pi/2$ | $\pi$ | $\pi/2$ | $\pi$ | $\pi/2$ | ... |

F I G. 7
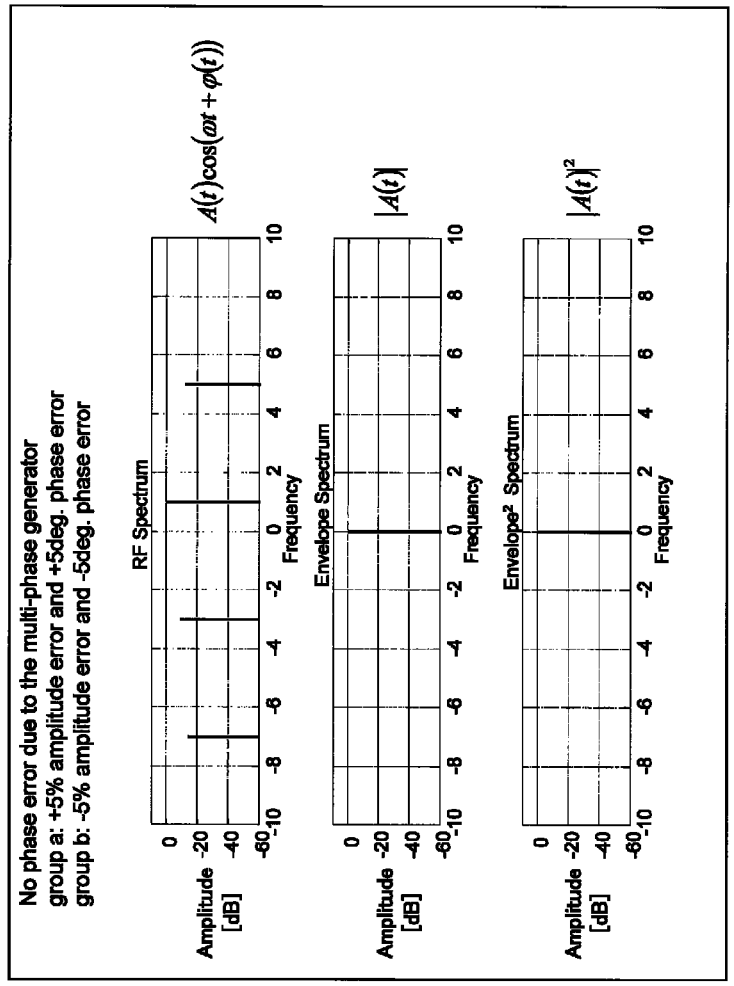

FIG. 10

| Time [samples] | 1 | 2 | 3 | 4 | ... |
|---|---|---|---|---|---|
| Phase of group a [rad] | 0 | $\pi$ | 0 | $\pi$ | ... |
| Phase of group b [rad] | $\pi$ | 0 | $\pi$ | 0 | ... |

| Time [samples] | 1 | 2 | 3 | 4 | ... |
|---|---|---|---|---|---|
| Phase of group a [rad] | $\pi/2$ | $-\pi/2$ | $\pi/2$ | $-\pi/2$ | ... |
| Phase of group b [rad] | $-\pi/2$ | $\pi/2$ | $-\pi/2$ | $\pi/2$ | ... |

F I G. 1 2

| Time [samples] | 1 | 2 | 3 | 4 | 5 | 6 | 7 | ... |
|---|---|---|---|---|---|---|---|---|
| Phase of group a [rad] | 0 | $\pi/2$ | $\pi$ | $-\pi/2$ | 0 | $\pi/2$ | $\pi$ | ... |
| Phase of group b [rad] | $\pi/2$ | $\pi$ | $-\pi/2$ | 0 | $\pi/2$ | $\pi$ | $-\pi/2$ | ... |

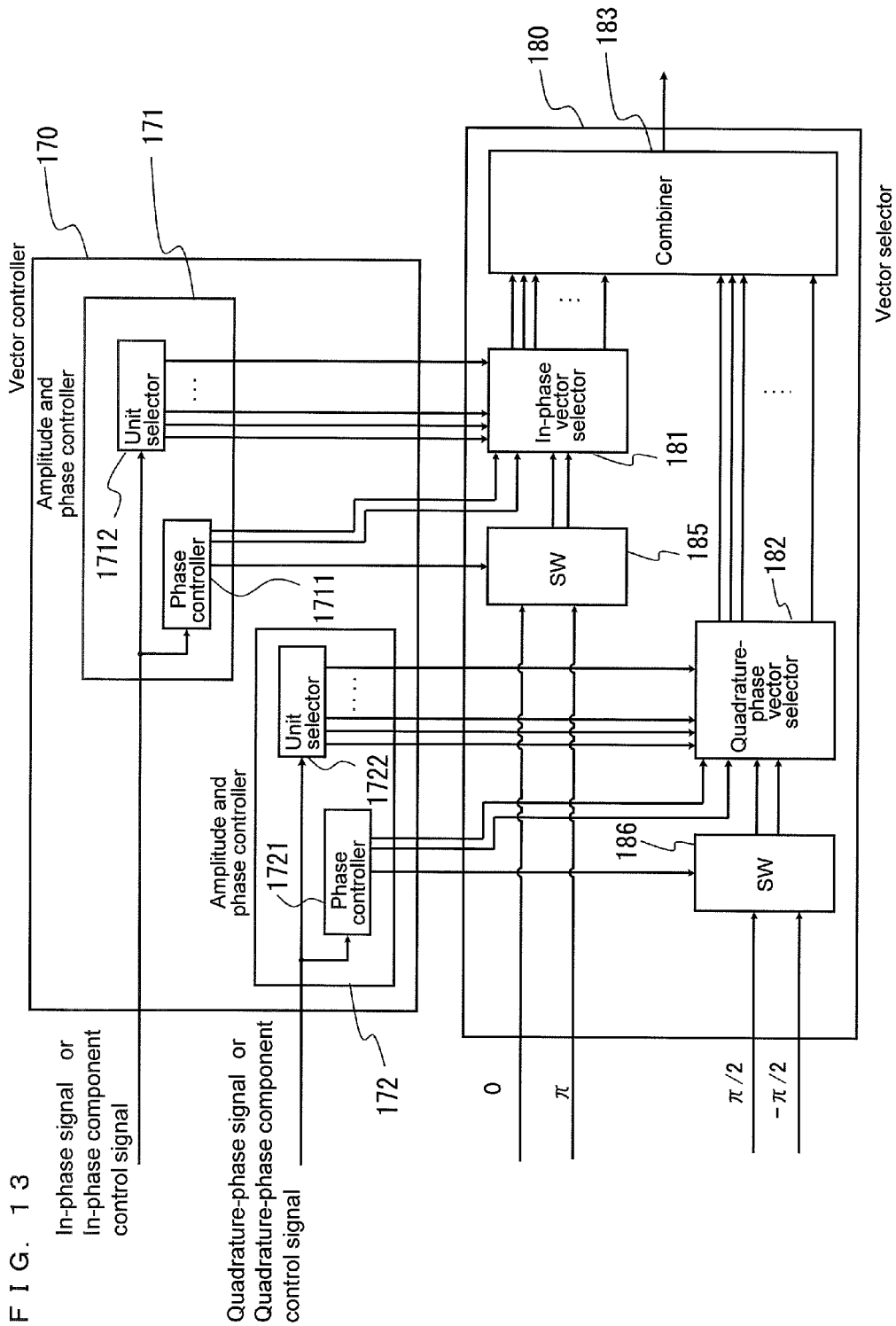

| Condition | $I_O$ | $Q_O$ |
|---|---|---|
| $I_I > 0, Q_I \geq 0$ | $I_I$ | $Q_I$ |
| $I_I \leq 0, Q_I > 0$ | $I_I - Q_I \sin\theta_2$ | $Q_I \cos\theta_2$ |
| $I_I < 0, Q_I \leq 0$ | $I_I \cos\theta_4 + Q_I \sin\theta_2$ | $Q_I \cos\theta_2 - I_I \sin\theta_4$ |
| $I_I \geq 0, Q_I < 0$ | $I_I - Q_I \sin(\theta_6 - \theta_2)$ | $Q_I \cos(\theta_6 - \theta_2)$ |

(b)

| Condition | $I_O$ | $Q_O$ |
|---|---|---|
| $I_I > 0, Q_I \geq 0$ | $I_I$ | $Q_I$ |
| $I_I \leq 0, Q_I > 0$ | $I_I - Q_I \theta_2$ | $Q_I$ |
| $I_I < 0, Q_I \leq 0$ | $I_I + Q_I \theta_2$ | $Q_I - I_I \theta_4$ |
| $I_I \geq 0, Q_I < 0$ | $I_I - Q_I(\theta_6 - \theta_2)$ | $Q_I$ |

FIG. 19

| zone | Condition | + axis | | x axis | |
|---|---|---|---|---|---|
| | | Number | Phase (θ1) | Number | Phase (θ2) |
| #1 | $I≥0, Q≥0, I>Q$ | $I-Q$ | $0$ | $Q$ | $π/4$ |
| #2 | $I>0, Q>0, I≤Q$ | $Q-I$ | $π/2$ | $I$ | $π/4$ |
| #3 | $I≤0, Q>0, |I|<Q$ | $Q-|I|$ | $π/2$ | $|I|$ | $3π/4$ |
| #4 | $I<0, Q>0, |I|≥Q$ | $|I|-Q$ | $π$ | $Q$ | $3π/4$ |
| #5 | $I<0, Q≤0, |I|>|Q|$ | $|I|-|Q|$ | $π$ | $|Q|$ | $-3π/4$ |
| #6 | $I<0, Q<0, |I|≤|Q|$ | $|Q|-|I|$ | $-π/2$ | $|I|$ | $-3π/4$ |
| #7 | $I≥0, Q<0, I<|Q|$ | $|Q|-I$ | $-π/2$ | $I$ | $-π/4$ |
| #8 | $I>0, Q<0, I≥|Q|$ | $I-|Q|$ | $0$ | $|Q|$ | $-π/4$ |

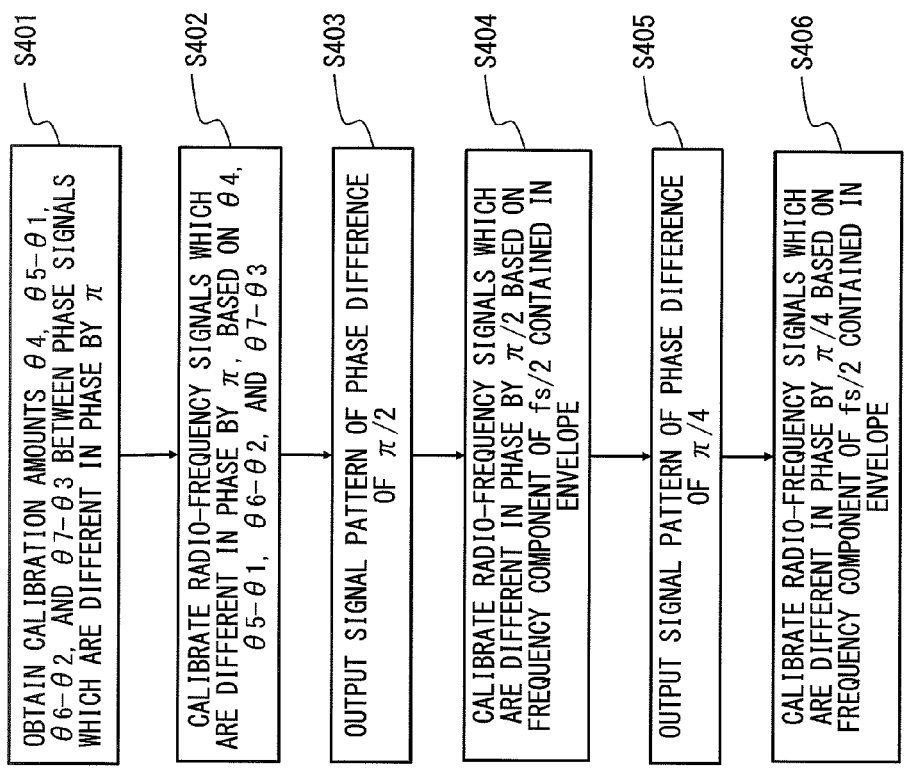

F I G. 2 1

| Time [samples] | 1 | 2 | 3 | 4 | 5 | 6 | 7 | ... |
|---|---|---|---|---|---|---|---|---|
| Phase of group a [rad] | 0 | $\pi/2$ | $\pi$ | $-\pi/2$ | 0 | $\pi/2$ | $\pi$ | ... |
| Phase of group b [rad] | $\pi/2$ | $\pi$ | $-\pi/2$ | 0 | $\pi/2$ | $\pi$ | $-\pi/2$ | ... |

| Time [samples] | 1 | 2 | 3 | 4 | 5 | 6 | 7 | ... |
|---|---|---|---|---|---|---|---|---|
| Phase of group a [rad] | $\pi/4$ | $3\pi/4$ | $-3\pi/4$ | $-\pi/4$ | $\pi/4$ | $3\pi/4$ | $-3\pi/4$ | ... |
| Phase of group b [rad] | $3\pi/4$ | $-3\pi/4$ | $-\pi/4$ | $\pi/4$ | $3\pi/4$ | $-3\pi/4$ | $-\pi/4$ | ... |

F I G. 2 2

| Time [samples] | 1 | 2 | 3 | 4 | 5 | 6 | 7 | 8 | 9 | 10 | 11 | ... |
|---|---|---|---|---|---|---|---|---|---|---|---|---|
| Phase of group a [rad] | 0 | $\pi/4$ | $\pi/2$ | $3\pi/4$ | $\pi$ | $-3\pi/4$ | $-\pi/2$ | $-\pi/4$ | 0 | $\pi/4$ | $\pi/2$ | ... |
| Phase of group b [rad] | $\pi/4$ | $\pi/2$ | $3\pi/4$ | $\pi$ | $-3\pi/4$ | $-\pi/2$ | $-\pi/4$ | 0 | $\pi/4$ | $\pi/2$ | $3\pi/4$ | ... |

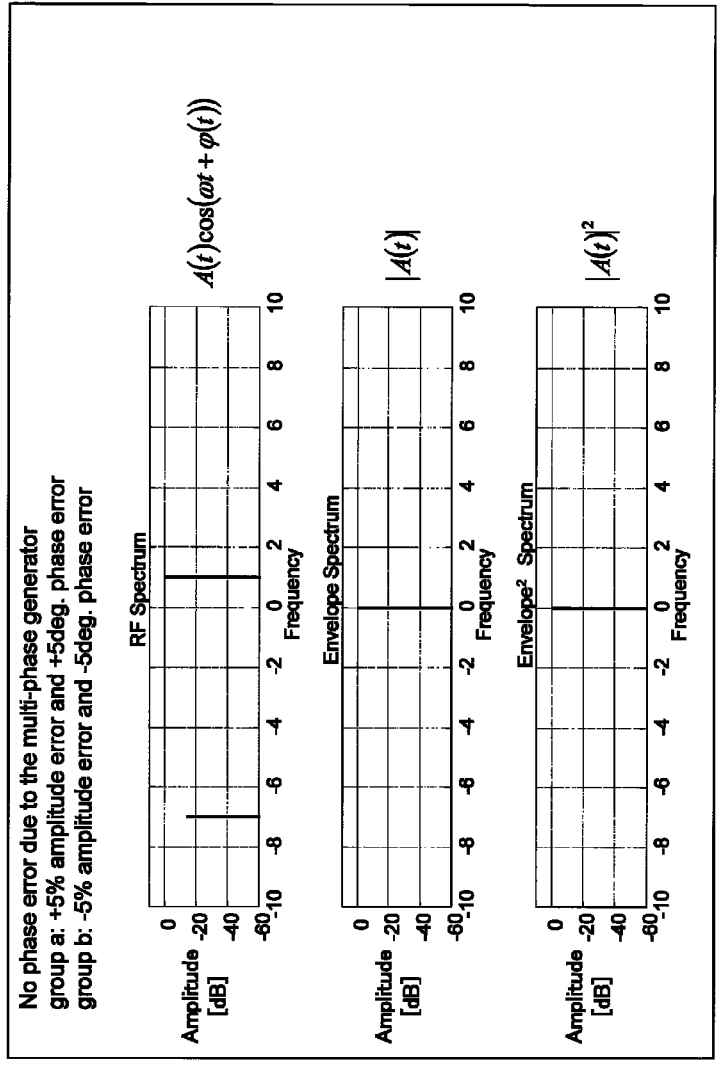

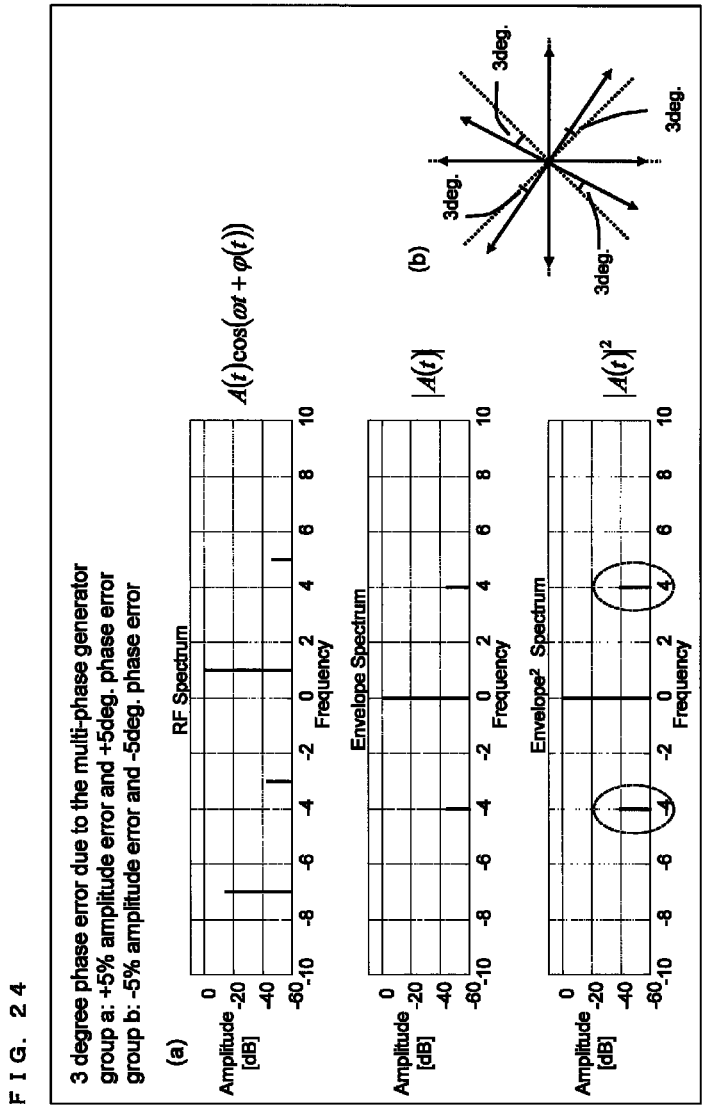

F I G. 2 6

| Time [samples] | 1 | 2 | 3 | 4 | ... |
|---|---|---|---|---|---|
| Phase of group a [rad] | 0 | π | 0 | π | ... |
| Phase of group b [rad] | π | 0 | π | 0 | ... |

| Time [samples] | 1 | 2 | 3 | 4 | ... |
|---|---|---|---|---|---|
| Phase of group a [rad] | π/2 | -π/2 | π/2 | -π/2 | ... |
| Phase of group b [rad] | -π/2 | π/2 | -π/2 | π/2 | ... |

| Time [samples] | 1 | 2 | 3 | 4 | ... |
|---|---|---|---|---|---|
| Phase of group a [rad] | π/4 | -3π/4 | π/4 | -3π/4 | ... |
| Phase of group b [rad] | -3π/4 | π/4 | -3π/4 | π/4 | ... |

| Time [samples] | 1 | 2 | 3 | 4 | ... |
|---|---|---|---|---|---|
| Phase of group a [rad] | 3π/4 | -π/4 | 3π/4 | -π/4 | ... |
| Phase of group b [rad] | -π/4 | 3π/4 | -π/4 | 3π/4 | ... |

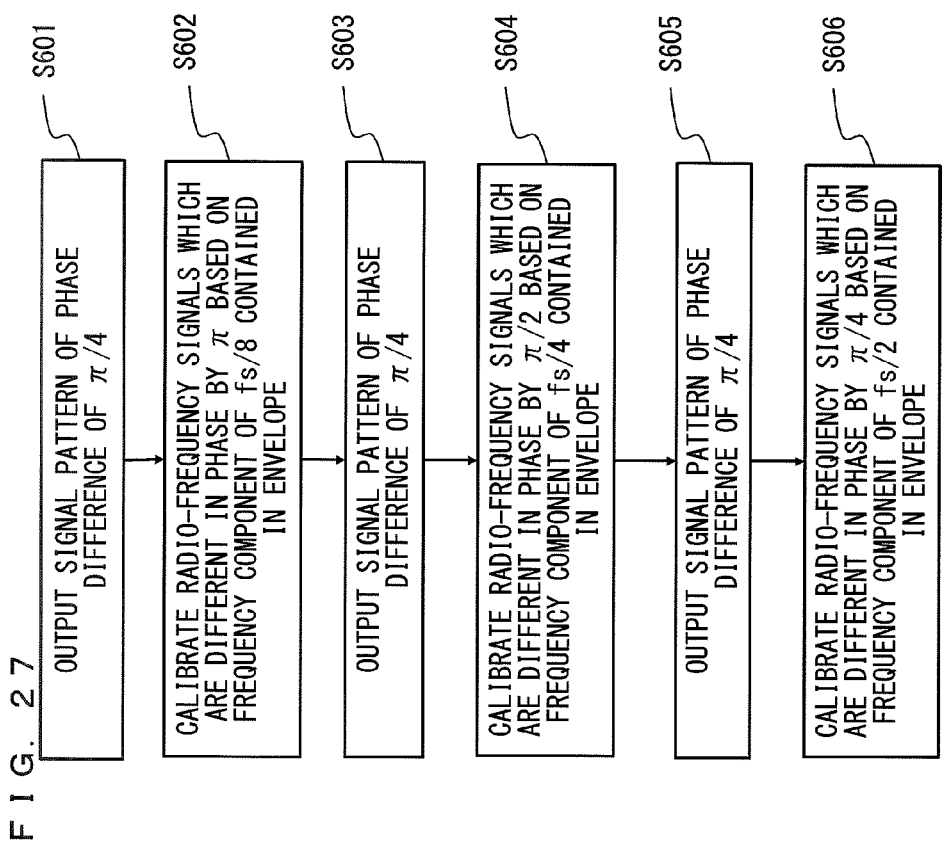

FIG. 33

| zone | Condition | $I_O$ | $Q_O$ |
|---|---|---|---|
| #1 | $I \geq 0, Q \geq 0, I > Q$ | $I_I + Q_I(-1 + \cos\theta_1 + \sin\theta_1)$ | $Q_I(\cos\theta_1 - \sin\theta_1)$ |
| #2 | $I > 0, Q > 0, I \leq Q$ | $I_I(\cos\theta_1 + \sin\theta_1 - \sin\theta_2) + Q_I\sin\theta_2$ | $Q_I\cos\theta_2 + I_I(\cos\theta_1 - \sin\theta_1 - \cos\theta_2)$ |
| #3 | $I \leq 0, Q > 0, |I| \leq Q$ | $I_I(\cos\theta_3 - \sin\theta_3 + \sin\theta_2) + Q_I\sin\theta_2$ | $Q_I\cos\theta_2 + I_I(\cos\theta_2 - \cos\theta_3 - \sin\theta_3)$ |
| #4 | $I < 0, Q > 0, |I| \geq Q$ | $I_I\cos\theta_4 + Q_I(\cos\theta_4 - \cos\theta_3 + \sin\theta_3)$ | $Q_I(\cos\theta_3 + \sin\theta_3 - \sin\theta_4) - I_I\sin\theta_4$ |
| #5 | $I < 0, Q \leq 0, |I| > |Q|$ | $I_I\cos\theta_4 + Q_I(\cos\theta_5 - \cos\theta_4 + \sin\theta_5)$ | $Q_I(\cos\theta_5 - \sin\theta_5 + \sin\theta_4) - I_I\sin\theta_4$ |
| #6 | $I < 0, Q < 0, |I| \leq |Q|$ | $I_I(\cos\theta_5 + \sin\theta_5 - \sin\theta_6) + Q_I\sin\theta_6$ | $Q_I\cos\theta_6 + I_I(\cos\theta_5 - \sin\theta_5 - \cos\theta_6)$ |
| #7 | $I \geq 0, Q < 0, I < |Q|$ | $I_I(\cos\theta_7 - \sin\theta_7 + \sin\theta_6) + Q_I\sin\theta_6$ | $Q_I\cos\theta_6 + I_I(\cos\theta_6 - \cos\theta_7 - \sin\theta_7)$ |
| #8 | $I > 0, Q < 0, I \geq |Q|$ | $I_I + Q_I(1 - \cos\theta_7 + \sin\theta_7)$ | $Q_I(\cos\theta_7 + \sin\theta_7)$ |

F I G. 3 4

| zone | Condition | $I_O$ | $Q_O$ |
|---|---|---|---|
| #1 | $I \geq 0, Q \geq 0, I > Q$ | $I_I + Q_I \theta_1$ | $Q_I(1-\theta_1)$ |
| #2 | $I > 0, Q > 0, I \leq Q$ | $I_I(1+\theta_I-\theta_2) + Q_I \theta_2$ | $Q_I - I_I \theta_1$ |
| #3 | $I \leq 0, Q > 0, |I| < Q$ | $I_I(1-\theta_3+\theta_2) + Q_I \theta_2$ | $Q_I - I_I \theta_3$ |
| #4 | $I < 0, Q > 0, |I| \geq Q$ | $I_I + Q_I \theta_3$ | $Q_I(1+\theta_3-\theta_4) - I_I \theta_4$ |
| #5 | $I < 0, Q \leq 0, |I| > |Q|$ | $I_I + Q_I \theta_5$ | $Q_I(1-\theta_5+\theta_4) - I_I \theta_4$ |
| #6 | $I < 0, Q < 0, |I| \leq |Q|$ | $I_I(1+\theta_5-\theta_6) + Q_I \theta_6$ | $Q_I - I_I \theta_5$ |
| #7 | $I \geq 0, Q < 0, I < |Q|$ | $I_I(1+\theta_6-\theta_7) + Q_I \theta_6$ | $Q_I - I_I \theta_7$ |
| #8 | $I > 0, Q < 0, I \geq |Q|$ | $I_I + Q_I \theta_7$ | $Q_I(1+\theta_7)$ |

CALIBRATION FOR RFDAC

BACKGROUND OF THE INVENTION

1. Field of the Invention

The present invention relates to an RFDAC (Radio Frequency Digital to Analog Converter) for converting digital signals to analog signals, and relates to an RFDAC for calibrating variation of elements and improving distortion properties.

2. Description of the Background Art

Conventionally, for an RFDAC, low distortion in transmission signals is required for ensuring a quality of the transmission signals. No calibration causes a problem such as spectrum regrowth and modulation accuracy degradation.

SUMMARY OF THE INVENTION

Therefore, an object of the present invention is to make available an RFDAC that enables reduction of a phase error.

In order to attain the aforementioned object, the present invention is directed to an RFDAC for performing digital-to-analog conversion of a baseband signal. The RFDAC includes: a multi-phase radio-frequency signal generator configured to generate at least radio-frequency signals that are different in phase; a vector selector into which the at least four radio-frequency signals are inputted, the vector selector configured to select two radio-frequency signals from among the at least four radio-frequency signals, cause each of the radio-frequency signals to pass through at least one transmission path, combine the two radio-frequency signals with each other, and output a combined signal; a test signal generator configured to generate and output a test signal; a multiplexer configured to select either the test signal or the baseband signal, and output the selected signal; a vector controller into which the signal selected by the multiplexer is inputted, the vector controller configured to control the vector selector based on the selected signal and at least one predetermined selection pattern, such that two radio-frequency signals among the at least four radio-frequency signals, and transmission paths of the two radio-frequency signals are selected; a detector configured to detect an output signal outputted from the vector selector; and a calibrator configured to calibrate a phase error between the two radio-frequency signals selected by the vector selector, based on an envelope of the output signal detected by the detector, when the multiplexer selects the test signal.

Further, when the multiplexer selects the test signal, the vector selector sequentially selects the two radio-frequency signals among the at least four radio-frequency signals, and the transmission paths of the two radio-frequency signals, based on the predetermined selection pattern, and the calibrator calibrates a phase error between radio-frequency signals corresponding to the two phases, based on a distribution of a spectrum of an envelope in a sampling period which is determined according to the predetermined selection pattern.

Further, the RFDAC further includes a variable phase controller that is connected preceding the vector selector, and configured to control phases of radio-frequency signals outputted from the multi-phase radio-frequency signal generator.

Alternatively, the RFDAC may further include: a LUT (look-up table) configured to store a calibration coefficient of the phase error, and a predistorter that is connected preceding the vector controller and configured to predistort the baseband signal outputted by the multiplexer, based on the calibration coefficient stored in the LUT.

Further, the at least four radio-frequency signals are radio-frequency signals having phases of $0$, $\pi/2$, $\pi$, and $-\pi/2$. The baseband signal includes an in-phase signal and a quadrature-phase signal, and the test signal includes an in-phase component control signal and a quadrature-phase component control signal. When the multiplexer selects the test signal, the vector selector controls the vector selector according to the predetermined selection pattern, to sequentially select the two radio-frequency signals, and the transmission paths of the radio-frequency signals, and the calibrator sequentially calibrates the phase error between the two radio-frequency signals, based on the output signal of the vector selector which is detected by the detector. Preferably, when the multiplexer selects the baseband signal, the vector controller controls the vector selector, and, among the IQ-phase signals, in the case of the in-phase signal indicating a non-negative value, a radio-frequency signal having a phase of $0$ is selected from among the radio-frequency signals, and in the case of the in-phase signal indicating a negative value, a radio-frequency signal having a phase of $\pi$ is selected, and, among the IQ-phase signals, in the case of the quadrature-phase signal indicating a non-negative value, a radio-frequency signal having a phase of $\pi/2$ is further selected, and, in the case of the quadrature-phase signal indicating a negative value, a radio-frequency signal having a phase of $-\pi/2$ is further selected.

Further, the vector controller includes an in-phase signal amplitude and phase controller and a quadrature-phase signal amplitude and phase controller. The vector selector includes a first switch, a second switch, an in-phase signal vector selector, a quadrature-phase signal vector selector, and a combiner. The in-phase signal amplitude and phase controller controls the first switch to select two radio-frequency signals from among the at least radio-frequency signals, and controls the in-phase signal vector selector to select one of the two radio-frequency signals. The quadrature-phase signal amplitude and phase controller controls the second switch based on the quadrature-phase signal, to select two other radio-frequency signals from among the at least four radio-frequency signals, and controls the quadrature-phase signal vector selector to select one of the two other radio-frequency signals. The combiner combines the radio-frequency signal outputted from the in-phase signal amplitude and phase controller, and the radio-frequency signal outputted from the quadrature-phase signal amplitude and phase controller, with each other, and outputs the combined signal.

Further, the in-phase signal vector selector preferably includes: a third switch and a fourth switch each of which selects one of the two radio-frequency signals selected by the first switch; a first switch bank having a plurality of switches each of which selects either a state in which a radio-frequency signal selected by the third switch is selected, or an off-state; and a second switch bank having a plurality of switches each of which selects either a state in which a radio-frequency signal selected by the fourth switch is selected, or an off-state. The in-phase signal amplitude and phase controller preferably includes: an in-phase signal phase controller that controls the first switch, the third switch, and the fourth switch, according to the in-phase signal and the predetermined selection pattern; and an in-phase signal unit selector that controls each switch of the first switch bank and each switch of the second switch bank, according to the in-phase signal and the predetermined selection pattern.

Further, the quadrature-phase signal vector selector preferably includes: a fifth switch and a sixth switch each of which selects one of the two radio-frequency signals selected by the second switch; a third switch bank having a plurality of switches each of which selects either a state in which a radio-frequency signal selected by the fifth switch is selected, or an off-state; and a fourth switch bank having a plurality of switches each of which selects either a state in which a radio-frequency signal selected by the sixth switch is selected, or an off-state. The quadrature-phase signal amplitude and phase controller preferably includes: a quadrature-phase signal phase controller that controls the second switch, the fifth switch, and the sixth switch, according to the quadrature-phase signal and the predetermined selection pattern; and a quadrature-phase signal unit selector that controls each switch of the third switch bank and each switch of the fourth switch bank, according to the quadrature-phase signal and the predetermined selection pattern.

Further, alternatively, the in-phase signal vector selector preferably includes: a third switch and a fourth switch each of which selects one of the two radio-frequency signals selected by the first switch; a first amplifier that amplifies a radio-frequency signal selected by the third switch; and a second amplifier that amplifies a radio-frequency signal selected by the fourth switch. The in-phase signal amplitude and phase controller preferably includes: an in-phase signal phase controller that controls the first switch, the third switch, and the fourth switch, according to the in-phase signal and the predetermined selection pattern; and an in-phase signal amplitude controller that controls amplification factors of the first amplifier and the second amplifier, according to the in-phase signal and the predetermined selection pattern.

Further, the quadrature-phase signal vector selector preferably includes: a fifth switch and a sixth switch each of which selects one of the two radio-frequency signals selected by the second switch; a third amplifier that amplifies a radio-frequency signal selected by the fifth switch; and a fourth amplifier that amplifies a radio-frequency signal selected by the sixth switch. The quadrature-phase signal amplitude and phase controller preferably includes: a quadrature-phase signal phase controller that controls the second switch, the fifth switch, and the sixth switch, according to the quadrature-phase signal and the predetermined selection pattern; and a quadrature-phase signal amplitude controller that controls amplification factors of the third amplifier and the fourth amplifier, according to the quadrature-phase signal and the predetermined selection pattern.

As the at least one predetermined selection pattern, patterns in which pairs of radio-frequency signals that are different in phase by $\pi$ are each selected periodically, or patterns in which pairs of radio-frequency signals that are different in phase by $\pi/2$ are each selected periodically, are used.

Further, alternatively, it is preferable that the RFDAC further includes: a decoder configured to receive the baseband signal including an in-phase signal and a quadrature-phase signal, to convert the baseband signal into a liner sum of two vectors which are included in eight vectors having directions corresponding to eight phases of $-\pi/2, 0, \pi/2, \pi, -3\pi/4, -\pi/4, \pi/4$, and $3\pi/4$, which form an angle of $\pi/4$, and which have non-negative coefficients, and to output information about magnitudes and phases of the two vectors in a predetermined form. The multi-phase radio-frequency signal generator preferably generates and outputs, as the at least four radio-frequency signals, eight radio-frequency signals having the eight phases. Preferably, when the multiplexer selects the test signal, the vector selector controls the vector selector according to the predetermined selection pattern, to sequentially select two radio-frequency signals among the eight radio-frequency signals and transmission paths of the two radio-frequency signals, and the calibrator sequentially calibrates a phase error between the two radio-frequency signals, based on an output signal of the vector selector which is detected by the detector. Preferably, when the multiplexer selects the baseband signal, the vector controller controls the vector selector based on the information about the magnitudes and the phases of the two vectors, to select radio-frequency signals corresponding to the phases of the two vectors, from among the eight radio-frequency signals.

Further, the vector selector preferably includes: a two phase selector that selects two radio-frequency signals from among the eight radio-frequency signals; a switch bank having a plurality of switches each of which selects one of the two radio-frequency signals selected by the two phase selector, or an off-state; and a combiner that combines the radio-frequency signals selected by each switch of the switch bank, with each other. The multiplexer preferably controls the two phase selector to select the phases of the two vectors among the eight radio-frequency signals. The vector controller preferably controls the switches of the switch bank.

As the at least one predetermined selection pattern, patterns in which pairs of radio-frequency signals that are different in phase by $\pi$ are each selected periodically, patterns in which pairs of radio-frequency signals that are different in phase by $\pi/2$ are each selected periodically, or patterns in which pairs of radio-frequency signals that are different in phase by $\pi/4$ are each selected periodically, are used.

The present invention is also directed to a wireless communication apparatus that includes: an antenna; an antenna switch connected to the antenna; a receiver connected to the antenna switch; and a transmitter, connected to the antenna switch, having incorporated therein the RFDAC described above.

Further, in order to attain the aforementioned object, a process performed by each component of the RFDAC of the present invention described above may be implemented as a distortion calibration method including a series of process steps. This method is implemented in a form of a program for causing a computer to execute the series of process step. The program may be incorporated in a computer by being stored in a non-transitory computer-readable storage medium.

As described above, according to the present invention, the RFDAC enables reduction of a phase error.

The present invention is useful for, for example, a transmitter for transmitting an RF signal and a wireless communication apparatus having the transmitted incorporated therein.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 illustrates exemplary selection patterns for the process performed by the RFDAC 100 according to the first embodiment of the present invention;

FIG. 7 illustrates exemplary spectrums of the output signal of the RFDAC 100 according to the first embodiment of the present invention;

FIG. 10 illustrates exemplary selection patterns for the process performed by the RFDAC 100 according to the second embodiment of the present invention;

FIG. 12 illustrates exemplary selection patterns for the process performed by the RFDAC 100 according to the third embodiment of the present invention;

FIG. 13 illustrates a vector controller and a vector selector of an RFDAC 100b according to a fourth embodiment of the present invention;

FIG. 15 illustrates an RFDAC 300 according to a sixth embodiment of the present invention;

FIG. 16 illustrates a calculation for calibration performed by the RFDAC 300 according to the sixth embodiment of the present invention;

FIG. 19 illustrates a conversion process performed by the RFDAC 400 according to the seventh embodiment of the present invention;

FIG. 20 illustrates a process performed by the RFDAC 400 according to the seventh embodiment of the present invention;

FIG. 21 illustrates exemplary selection patterns for the process performed by the RFDAC 400 according to the seventh embodiment of the present invention;

FIG. 22 illustrates exemplary selection patterns for the process performed by the RFDAC 400 according to the seventh embodiment of the present invention;

FIG. 23 illustrates exemplary spectrums of an output signal of the RFDAC 400 according to the seventh embodiment of the present invention;

FIG. 24 illustrates exemplary spectrums of an output signal of the RFDAC 400 according to the seventh embodiment of the present invention;

FIG. 26 illustrates exemplary selection patterns for the process performed by the RFDAC 400 according to the eighth embodiment of the present invention;

FIG. 27 illustrates a process performed by the RFDAC 400 according to a ninth embodiment of the present invention;

FIG. 33 illustrates a calculation for calibration performed by the RFDAC 500 according to the tenth embodiment of the present invention;

FIG. 34 illustrates a calculation for calibration performed by the RFDAC 500 according to the tenth embodiment of the present invention.

DESCRIPTION OF THE PREFERRED EMBODIMENTS

First Embodiment

Figure 1:
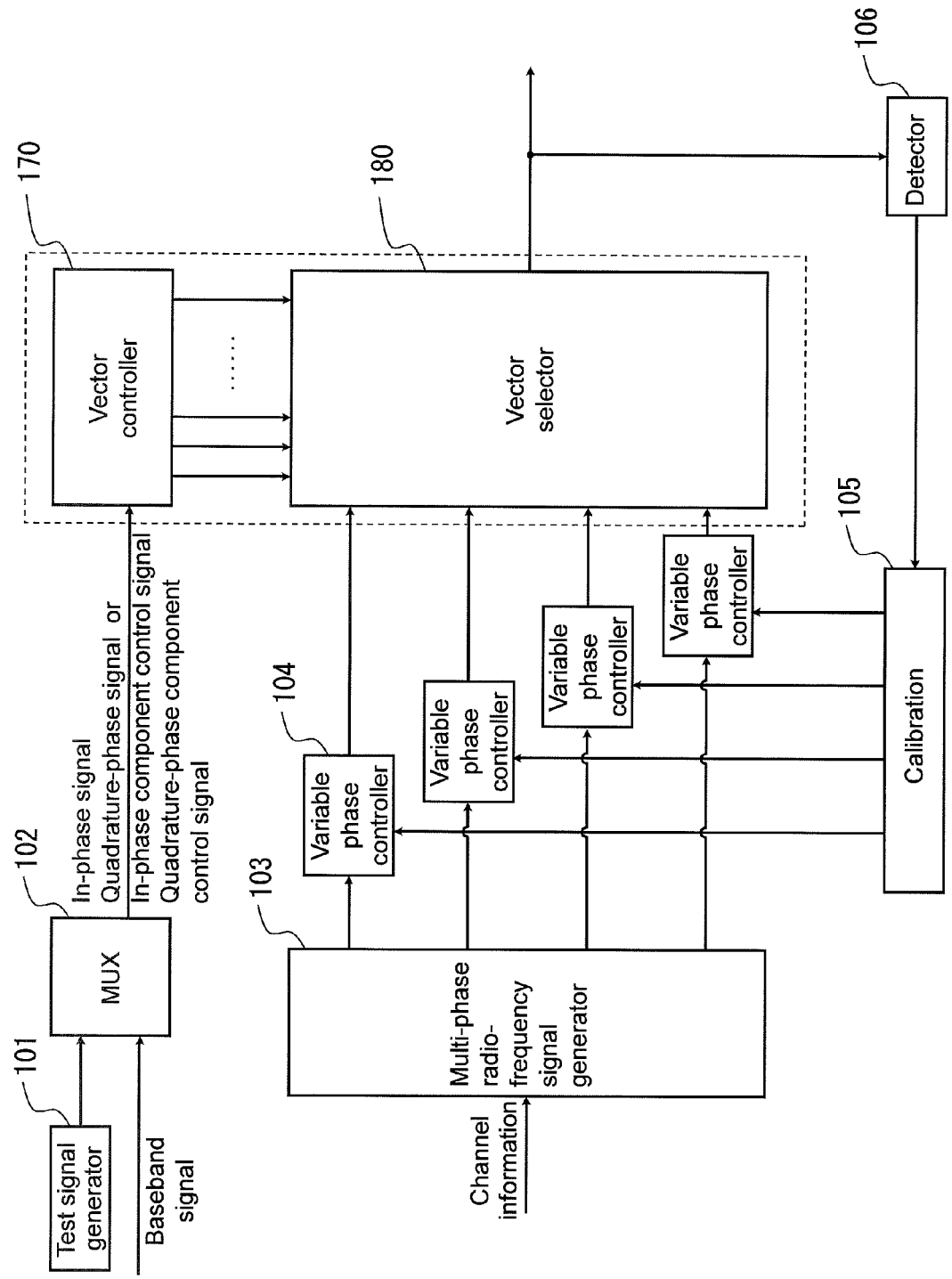
FIG. 1 illustrates an RFDAC 100 according to a first embodiment of the present invention.

FIG. 1 illustrates an outline of an RFDAC 100 according to the present embodiment. The RFDAC 100 includes a test signal generator 101, a multiplexer 102, a vector controller 170, a multi-phase radio-frequency signal generator 103, variable phase controllers 104, a calibrator 105, a detector 106, and a vector selector 180.

The test signal generator 101 generates and outputs a test signal. The multiplexer 102 selects and outputs either a baseband signal or the test signal. The test signal is used to select two radio-frequency signals from among a plurality of radio-frequency signals that are different in phase and are outputted from the multi-phase radio-frequency signal generator 103, and control an amplitude of each signal. The test signal includes an in-phase component control signal and a quadrature-phase component control signal. The baseband signal is also an IQ-phase signal that includes an in-phase signal and a quadrature-phase signal. The in-phase signal represents an in-phase component, and the quadrature-phase signal represents a quadrature-phase component. The vector controller 170 controls the vector selector 180 based on a signal outputted from the multiplexer 102.

The multi-phase radio-frequency signal generator 103 generates and outputs a plurality of radio-frequency signals that are different in phase. In the present embodiment, radio-frequency signals having phases of 0, $\pi/2$, $\pi$, and $-\pi/2$ (radian) are outputted. A frequency of each outputted radio-frequency signal is determined based on channel information inputted to the multi-phase radio-frequency signal generator 103. When a frequency of radio-frequency signal need not be controlled based on the channel information, for example, when a frequency of the radio-frequency signal is fixed, the channel information need not be inputted to the channel information multi-phase radio-frequency signal generator 103.

The radio-frequency signals outputted from the multi-phase radio-frequency signal generator 103 are inputted to the vector selector 180 via the variable phase controllers 104, respectively. Based on the control from the vector controller 170, the vector selector 180 selects from the radio-frequency signals having been inputted, combines the selected radio-frequency signals with each other, and output a resultant signal.

The detector 106 detects an output signal outputted from the vector selector 180. The calibrator 105 controls each variable phase controller 104 based on the detected output signal. The variable phase controllers 104 calibrate the inputted radio-frequency signals based on the control from the calibrator 105, and output resultant signals.

Hereinafter, a configuration of the RFDAC 100 will be described in detail.

Figure 2:
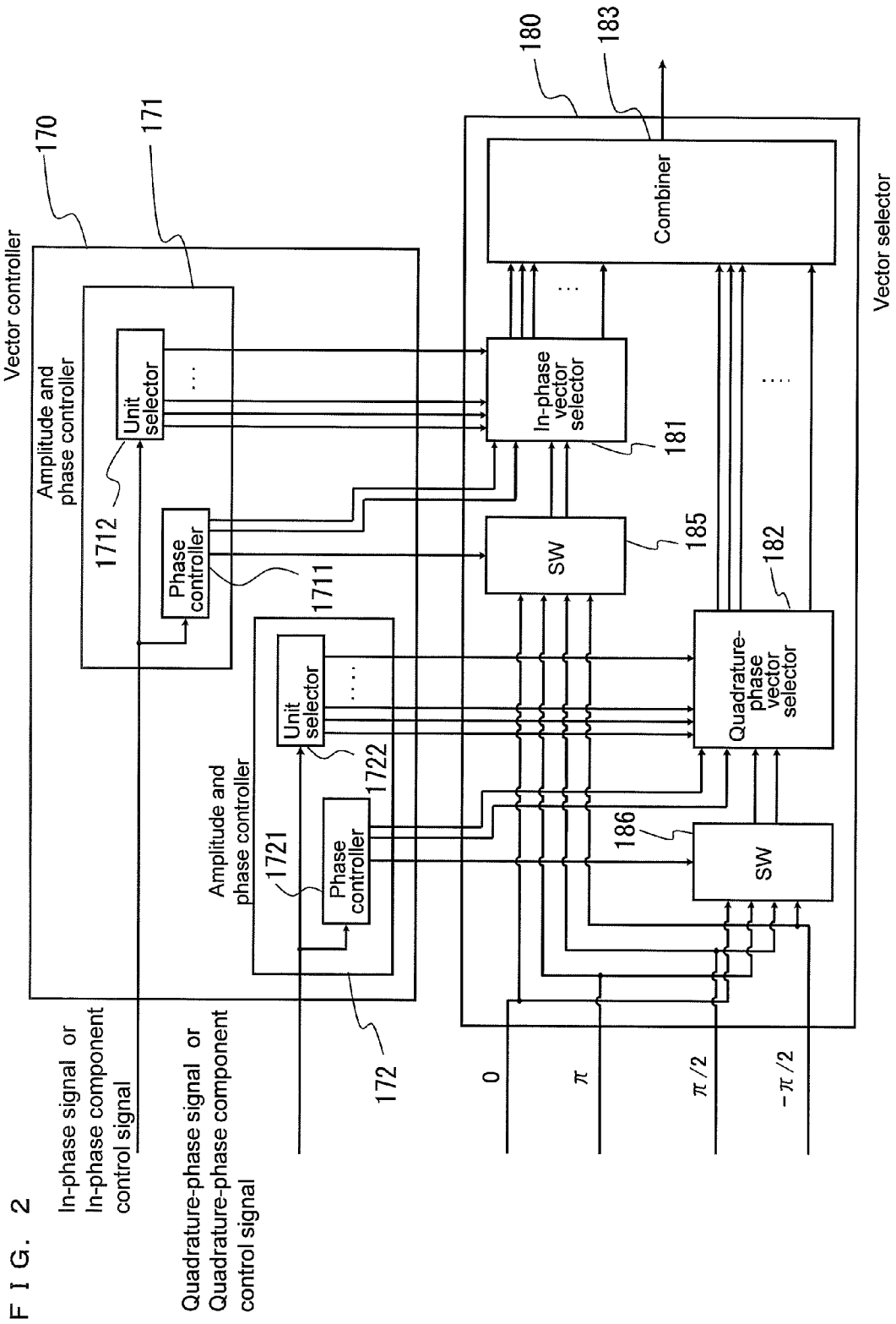
FIG. 2 illustrates a vector controller and a vector selector of the RFDAC 100 according to the first embodiment of the present invention.

FIG. 2 illustrates an internal configuration of the vector controller 170 and the vector selector 180 of the RFDAC 100. The vector controller 170 includes an in-phase signal amplitude and phase controller 171 and a quadrature-phase signal amplitude and phase controller 172. The vector selector 180 includes a first switch 185, a second switch 186, an in-phase signal vector selector 181, a quadrature-phase signal vector selector 182, and a combiner 183.

Figure 3:
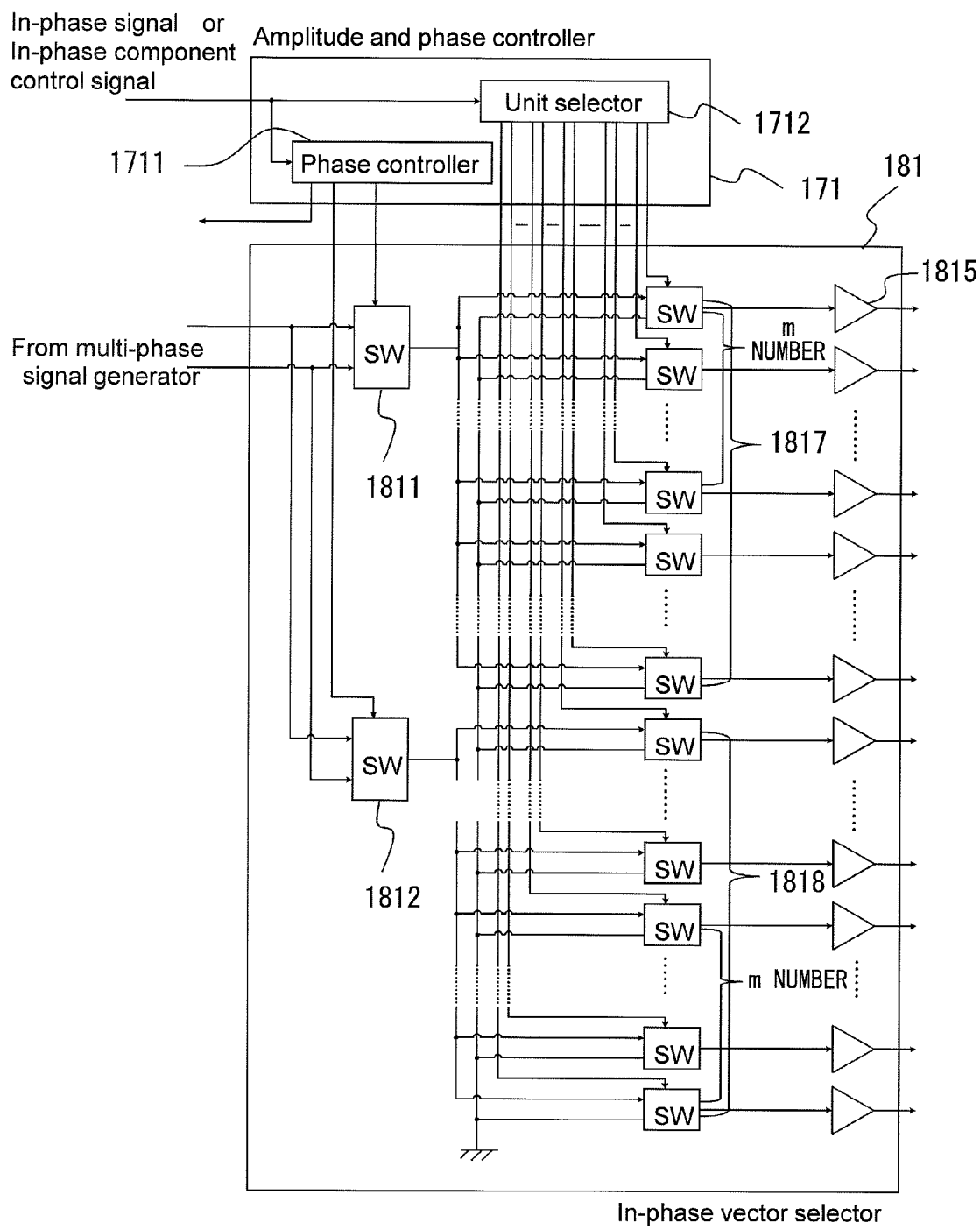
FIG. 3 illustrates a portion of the vector controller and the vector selector of the RFDAC 100 according to the first embodiment of the present invention.

FIG. 3 illustrates an internal configuration of the in-phase signal amplitude and phase controller 171 and the in-phase signal vector selector 181, which are shown in FIG. 2. An in-phase signal is inputted to the in-phase signal amplitude and phase controller 171 when the multiplexer 102 selects the baseband signal, while an in-phase component control signal is inputted to the in-phase signal amplitude and phase controller 171 when the multiplexer 102 selects the test signal. The in-phase signal amplitude and phase controller 171 includes a phase controller 1711 and a unit selector 1712.

The in-phase signal vector selector 181 includes a third switch 1811, a fourth switch 1812, a first switch bank 1817 and a second switch bank 1818 each of which includes a plurality of switches, and a plurality of amplifiers 1815. An internal configuration of the quadrature-phase signal amplitude and phase controller 172 and the quadrature-phase signal vector selector 182 is the same as that for the in-phase signal vector selector 181, and is not illustrated.

A quadrature-phase signal is inputted to the quadrature-phase signal amplitude and phase controller 172 when the multiplexer 102 selects the baseband signal, while the quadrature-phase component control signal is inputted to the quadrature-phase signal amplitude and phase controller 172 when the multiplexer 102 selects the test signal. The quadrature-phase signal amplitude and phase controller 172 includes a phase controller 1721 and a unit selector 1722.

The quadrature-phase signal vector selector 182 includes a fifth switch 1821, a sixth switch 1822, a third switch bank 1827 and a fourth switch bank 1828 each of which includes a plurality of switches, and a plurality of amplifiers 1825. When a signal intensity of each radio-frequency signal is sufficiently high, the amplifiers 1815 and 1825 may not be provided.

The first switch 185 and the second switch 186 of the vector selector 180 are controlled by the phase controller 1711 of the in-phase signal amplitude and phase controller 171 and the phase controller 1721 of the quadrature-phase signal amplitude and phase controller 172, respectively. Radio-frequency signals having phases of 0, $\pi$, $\pi/2$, and $-\pi/2$ are inputted to the first switch 185.

When the multiplexer 102 selects the baseband signal, the phase controller 1711 controls the first switch 185 based on the in-phase signal, and when the multiplexer 102 selects the test signal, the phase controller 1711 controls the first switch 185 based on the in-phase component control signal, such that the first switch 185 selects two of the radio-frequency signals having been inputted.

Further, when the multiplexer 102 selects the baseband signal, the phase controller 1711 controls the third switch 1811 and the fourth switch 1812 based on the in-phase signal, and when the multiplexer 102 selects the test signal, the phase controller 1711 controls the third switch 1811 and the fourth switch 1812 based on the in-phase component control signal, such that each of the third switch 1811 and the fourth switch 1812 selects one of the two radio-frequency signals selected by the first switch 185.

When the multiplexer 102 selects the baseband signal, the unit selector 1712 controls each switch of the first switch bank 1817 of the in-phase signal vector selector 481 based on the in-phase signal, and when the multiplexer 102 selects the test signal, the unit selector 1712 controls each switch of the first switch bank 1817 of the in-phase signal vector selector 481 based on the in-phase component control signal, such that each switch selects either a state (on-state) in which the radio-frequency signal selected by the third switch 1811 is selected, or an off-state. When the in-phase signal is selected, the number of the switches that are to be on is controlled according to an amplitude of the in-phase signal.

Further, when the multiplexer 102 selects the baseband signal, the unit selector 1712 controls each switch of the second switch bank 1818 of the in-phase signal vector selector 181 based on the in-phase signal, and when the multiplexer 102 selects the test signal, the unit controller 1712 controls each switch of the second switch bank 1818 of the in-phase signal vector selector 181 based on the in-phase component control signal, such that each switch selects either a state (on-state) in which the radio-frequency signal selected by the fourth switch 1812 is selected, or an off-state. When the in-phase signal is selected, the number of the switches that are to be on is controlled according to an amplitude of the in-phase signal.

By the operation described above, the unit selector 1712 conforms, to a magnitude of an amplitude of the in-phase signal, magnitudes of amplitudes of the radio-frequency signals having passed through switches that are on. The outputs of the switches of the first switch bank 1817 and the second switch bank 1818 are amplified by the amplifies 1815, respectively, and are outputted as outputs of a plurality of paths of the in-phase signal vector selector 181. Namely, groups of the switches of the first switch bank 1817 and the second switch bank 1818, and the amplifiers 1815 connected to the switches, respectively, function as transmission paths of the radio-frequency signals, thereby forming one output unit.

Radio-frequency signals having phases of 0, $\pi$, $\pi/2$, and $-\pi/2$ are inputted to the second switch 186. When the multiplexer 102 selects the baseband signal, the phase controller 1721 controls the second switch 186 based on the quadrature-phase signal, and when the multiplexer 102 selects the test signal, the phase controller 1721 controls the second switch 186 based on the quadrature-phase component control signal, such that the second switch 186 selects two of the radio-frequency signals having been inputted.

Further, when the multiplexer 102 selects the baseband signal, the phase controller 1721 controls the fifth switch 1821 and the sixth switch 1822 based on the quadrature-phase signal, and when the multiplexer 102 selects the test signal, the phase controller 1721 controls the fifth switch 1821 and the sixth switch 1822 based on the quadrature-phase component control signal, such that each of the fifth switch 1821 and the sixth switch 1822 selects one of the two radio-frequency signals selected by the second switch 186.

When the multiplexer 102 selects the baseband signal, the unit selector 1722 controls each switch of the third switch bank 1827 of the quadrature-phase signal vector selector 182 based on the quadrature-phase signal, and when the multiplexer 102 selects the test signal, the unit selector 1722 controls each switch of the third switch bank 1827 of the quadrature-phase signal vector selector 182 based on the quadrature-phase component control signal, such that each switch selects either an on-state in which the radio-frequency signal selected by the fifth switch 1821 is selected, or an off-state. When the quadrature-phase signal is selected, the number of the switches that are to be on is controlled according to an amplitude of the quadrature-phase signal.

Further, when the multiplexer 102 selects the baseband signal, the unit selector 1722 controls each switch of the fourth switch bank 1828 of the quadrature-phase signal vector selector 182 based on the quadrature-phase signal, and when the multiplexer 102 selects the test signal, the unit selector 1722 controls each switch of the fourth switch bank 1828 of the quadrature-phase signal vector selector 182 based on the quadrature-phase component control signal, such that each switch selects either an on-state in which the radio-frequency signal selected by the sixth switch 1822 is selected, or an off-state. When the quadrature-phase signal is selected, the number of the switches that are to be on is controlled according to an amplitude of the quadrature-phase signal. Magnitudes of amplitudes of the radio-frequency signals having passed through switches that are on, are conformed to a magnitude of an amplitude of the quadrature-phase signal.

By the operation described above, the unit selector 1722 conforms, to a magnitude of an amplitude of the quadrature-phase signal, magnitudes of amplitudes of the radio-frequency signals having passed through switches that are on. The outputs of the switches of the third switch bank 1827 and the fourth switch bank 1828 are amplified by the amplifies 1825, respectively, and are outputted as outputs of a plurality of paths of the quadrature-phase signal vector selector 182. Namely, groups of the switches of the third switch bank 1827 and the fourth switch bank 1828, and the amplifiers 1825 connected to the switches, respectively, function as transmission paths of the radio-frequency signals, thereby forming one output unit. Thus, the plurality of switches included in the vector selector 180 select from the radio-frequency signals inputted to the vector selector 180, and output units through which the radio-frequency signals are to be outputted, namely, transmission paths through which the radio-frequency signals are to pass, are determined.

The combiner 183 combines outputs of the in-phase signal vector selector 181 and the quadrature-phase signal vector selector 182 with each other, and outputs a resultant output as an output of the RFDAC 100.

Operations performed by the RFDAC 100 will be described separately according to whether the multiplexer 102 selects the test signal or the baseband signal.

(Case where Test Signal is Selected)

The RFDAC 100 operates to calibrate a phase error. In a state where a phase calibration by the variable phase controllers 104 is off, the RFDAC 100 calibrates a phase error. Phase errors relative to ideal states of the radio-frequency signals having phases of $\pi/2$, $\pi$, and $-\pi/2$ are represented as $\theta_2$, $\theta_4$, and $\theta_6$, respectively, which are obtained based on the radio-frequency signal having a phase of 0.

Figure 4:
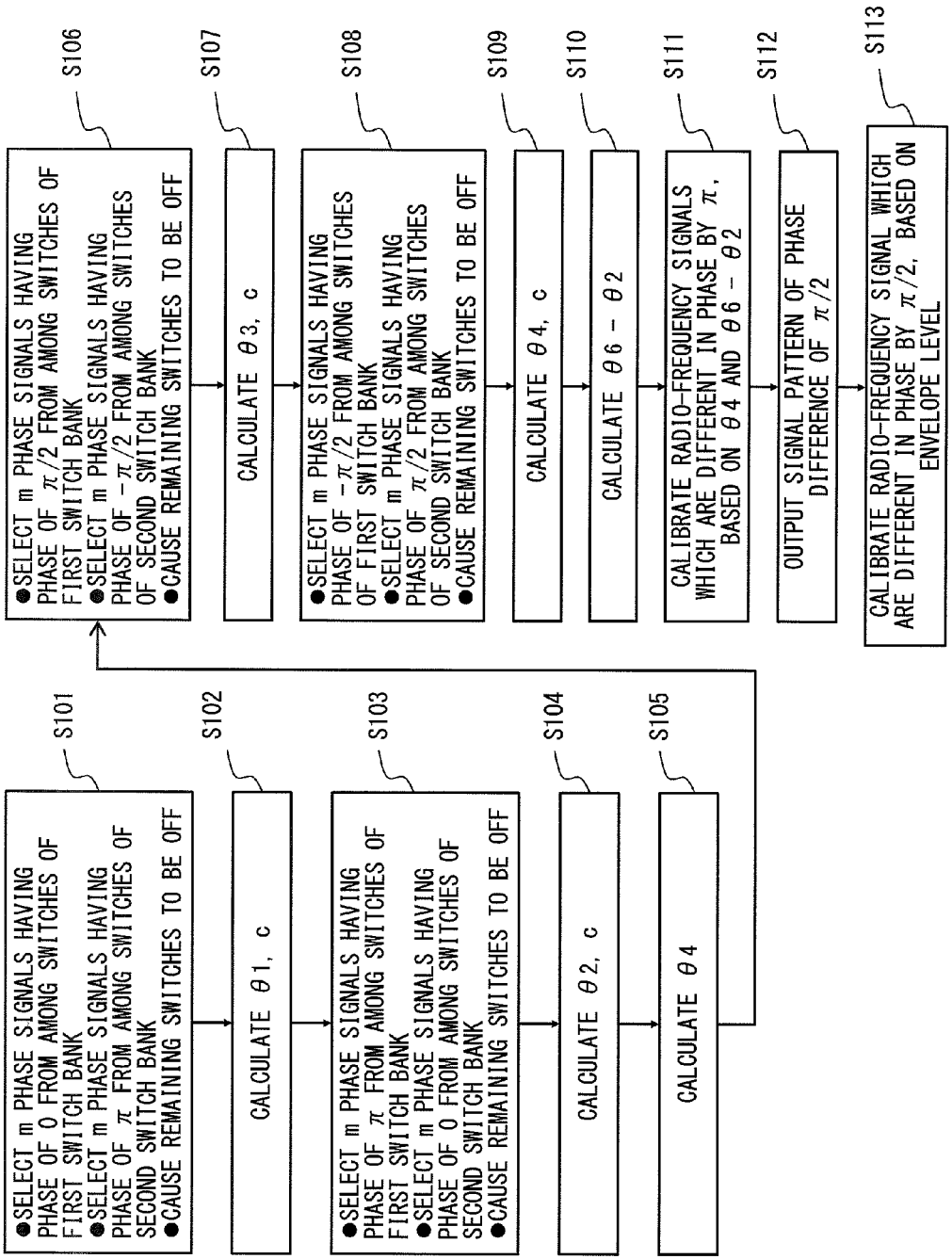
FIG. 4 illustrates a process performed by the RFDAC 100 according to the first embodiment of the present invention.

FIG. 4 shows a flow of the calibration process. Firstly, the phase controller 1711 controls the first switch 185, and the third switch 1811 and the fourth switch 1812 of the in-phase signal vector selector 181, to select two radio-frequency signals that are different in phase by $\pi$. The unit selector 1712 causes m switches (referred to as a group a) of the first switch bank 1817 to select the radio-frequency signal having a phase of 0, causes m switches (referred to as a group b) of the second switch bank 1818 to select the radio-frequency signal having a phase of $\pi$, and causes the remaining switches of each switch bank to be off (step S101).

Figure 5:
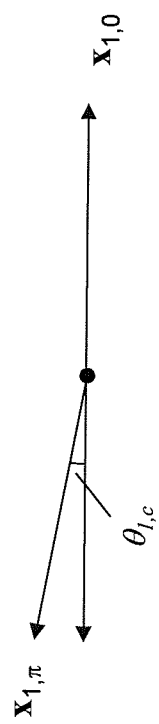
FIG. 5 illustrates an output signal of the RFDAC 100 according to the first embodiment of the present invention.

The detector 106 detects an output signal outputted from the vector selector 180. A total sum of vectors of the output signals from the m switches of the first switch bank 1817 is represented as $x_{1,0}$, and a total sum of the vectors of the output signals from the m switches of the second switch bank 188 is represented as $x_{1,\pi}$. These vectors are shown in FIG. 5.

Ideally, $x_{1,0}$ and $x_{1,\pi}$ have an equal amplitude, and directions that are different from each other by an angle $\pi$. However, in practice, a difference in direction between these vectors deviates from $\pi$ by $\theta_{1,c}$, as shown in FIG. 5, due to phase errors of the radio-frequency signals outputted from the multi-phase radio-frequency signal generator 103

The calibrator 105 calculates a phase deviation $\theta_{1,c}$ by using these vectors (step S102). Specifically, a negative sign or a positive sign is changed at a phase at which a magnitude of a residual vector which is represented by the output signal and obtained by changing values of the variable phase controllers 104 is minimal, to obtain $\theta_{1,c}$.

Next, the phase controller 1711 controls the first switch 185, and the third switch 1811 and the fourth switch 1812 of the in-phase signal vector selector 181, to select radio-frequency signals that are different in phase by $\pi$. The unit selector 1712 causes m switches (referred to as a group a) of the first switch bank 1817 to select the radio-frequency signal having a phase of it, causes m switches (referred to as a group b) of the second switch bank 1818 to select the radio-frequency signal having a phase of 0, and causes the remaining switches of each switch bank to be off (step S103).

The detector 106 detects an output signal outputted from the vector selector 180. A total sum of vectors of the output signals from the m switches of the first switch bank 1813 is represented as $x_{2,0}$, and a total sum of the vectors of the output signals from the m switches of the second switch bank 1814 is represented as $x_{2,\pi}$. A difference in direction between these vectors deviates from it by $\theta_{2,c}$. The calibrator 105 calculates a phase deviation $\theta_{2,c}$ by using these vectors (step S104).

The calibrator 105 calculates, by using the phase deviations $\theta_{1,c}$ and $\theta_{2,c}$, the phase error $\theta_4$ between the radio-frequency signals that have phases of 0 and $\pi$ and that are outputted by the multi-phase radio-frequency signal generator 103 (step S105). The phase error $\theta_4$ indicates a value obtained by deleting, from the phase deviations $\theta_{1,c}$ and $\theta_{2,c}$, a phase deviation which is caused by the difference in amplitude and phase between the first switch bank 1813 and the second switch bank 1814, and $\theta_4$ is obtained as $\theta_4=(\theta_{1,c}+\theta_{2,c})/2$. The switch banks through which the two radio-frequency signals pass through are replaced with each other, and phase deviation between the radio-frequency signals which are obtained before and after the replacement is used, to cancel the phase deviation caused by output paths, thereby obtaining a phase error in the multi-phase radio-frequency signal generator 103 itself.

Next, as the radio-frequency signals that are different in phase by $\pi$, the radio-frequency signals having phases of $\pi/2$ and $-\pi/2$ are selected, and the same process steps of step S101 to S105 are performed. Thus, phase deviations $\theta_{3,c}$ and $\theta_{4,c}$ between the radio-frequency signals which are obtained when the signals having the phases of $\pi/2$ and $-\pi/2$ pass through the switch banks, are obtained, to further calculate a phase error $\theta_6-\theta_2$ (step S106 to step S110).

The calibrator 105 controls the variable phase controllers 104 to reduce, by $\theta_4$, the phase of the radio-frequency signal having a phase of $\pi$, and reduce, by $\theta_6-\theta_2$, the phase of the radio-frequency signal having a phase of $\pi/2$ (step S111). Thus, a phase error between the two radio-frequency signals that are different in phase by $\pi$ can be calibrated.

Next, the phase controller 1711 controls the first switch 185, and the third switch 1811 and the fourth switch 1812, to sequentially select two radio-frequency signals that are different in phase by $\pi/2$ (phases of 0 and $\pi/2$, phases of $\pi/2$ and $\pi$, phases of $\pi$ and $\pi/2$, and phases of $-\pi/2$ and 0).

The unit selector 1712 causes m switches belonging to the group a of the first switch bank 1817 to select one of the two radio-frequency signals, causes m switches belonging to the group b of the second switch bank 1818 to select the other of the two radio-frequency signals, and causes the remaining switches of each switch bank to be off (step S112).

(a), (b), and (c) of FIG. 6 show exemplary selection patterns in each of which two radio-frequency signals that are different in phase by $\pi/2$ are selected. In step S112, one of the selection patterns shown in FIG. 6 is executed.

The detector 106 detects an output signal outputted from the vector selector 180. The calibrator 105 controls the variable phase controllers 104 based on an envelope level of the output signal, and calibrates the phase error between the radio-frequency signals having radio-frequency signal phases of $\pi/2$ and $-\pi/2$ (step S113). As described above, a phase error between any two radio-frequency signals is calibrated.

FIG. 7 shows a spectrum of an output signal, an envelope, and the square of the envelope which are obtained when the selection pattern indicated as (a) of FIG. 6 is executed in a state where: no phase error occurs in the radio-frequency signals outputted by the multi-phase radio-frequency signal generator 103; the switches belonging to the group a indicate an amplitude error of +5% and a phase error of +5%; and the switches belonging to the group b indicate an amplitude error of −5% and a phase error of −5%.

The output signal is represented as $A(t)\cos(\omega t+\psi(t))$ in which $A(t)$ represents an amplitude at time t. $\psi(t)$ represents an advance or a delay of a phase that is determined according to the selected radio-frequency signal. The error in each switch causes dispersion in spectrum of the output signal. However, no dispersion occurs in the envelope $|A(t)|$ and the spectrum of the square $|A(t)|^2$ of the envelope.

Figure 8:
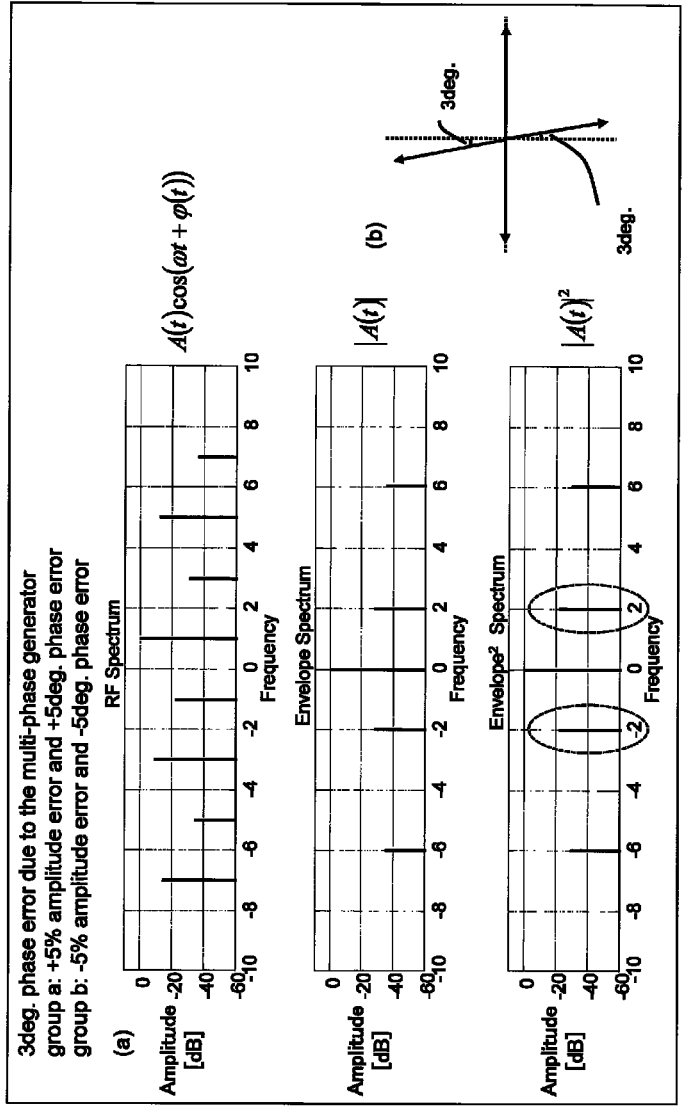
FIG. 8 illustrates exemplary spectrums of the output signal of the RFDAC 100 according to the first embodiment of the present invention.

(a) of FIG. 8 shows a spectrum obtained when a phase error of 3° (degrees) occurs in the radio-frequency signals that have phases of $\pi/2$ and $-\pi/2$ and that are outputted from the multi-phase radio-frequency signal generator 103 in a state described above with reference to FIG. 1 and FIG. 7. (b) of FIG. 8 shows a phase error of the radio-frequency signals having phases of $\pi/2$ and $-\pi/2$, by using an IQ plane.

Errors of the radio-frequency signals outputted from the multi-phase radio-frequency signal generator 103 cause dispersion in the envelope and the square of the envelope. In the selection pattern shown in (a) of FIG. 6, a frequency of a specific combination of radio-frequency signals is fs/4 when a sampling switching frequency is fs. When a phase error is contained in the specific combination of the radio-frequency signals, the envelope contains a frequency component of fs/2. Therefore, the calibrator 105 increases or decreases a calibration coefficient performed by the variable phase controllers 104, in step S113, to minimize a level of the frequency component of fs/2 contained in the envelope, so that a phase error between two radio-frequency signals that are different in phase by $\pi$ can be calibrated.

Alternatively, the calibrator 105 may calculate magnitudes of $\theta_2$ and $\theta_6$ described above, based on the frequency component of fs/2 contained in the spectrum of the envelope, and control the variable phase controllers 104, to reduce phases of the radio-frequency signals having radio-frequency signal phases of $\pi/2$ and $-\pi/2$ by $\theta_2$ and $\theta_6$, respectively, thereby calibrating the phase error.

Selection patterns may be executed so as to replace the output paths of the two radio-frequency signals with each other, and the phase deviation caused by the output paths may be canceled based on the envelope pattern, to calibrate the phase error in the multi-phase radio-frequency signal generator 103 itself. The calibration process may be performed by using the quadrature-phase signal amplitude and phase controller 172 and the quadrature-phase signal vector selector 182, instead of the in-phase signal amplitude and phase controller 171 and the in-phase signal vector selector 181.

(Case where Baseband Signal is Selected)

The RFDAC 100 operates for baseband transmission. Phases of the radio-frequency signals inputted to the vector selector 180 are calibrated by the variable phase controllers 104.

The phase controller 1711 of the in-phase signal amplitude and phase controller 171 causes the first switch 185 to select the radio-frequency signals having phases of 0 and $\pi$. Further, when the most recently inputted in-phase signal of the baseband signal indicates a non-negative value, the phase controller 1711 causes each of the third switch 1811 and the fourth switch 1812 to select the radio-frequency signal having a phase of 0.

Further, when the most recently inputted in-phase signal indicates a negative value, the third switch 1811 and the fourth switch 1812 are each caused to select the radio-frequency signal having a phase of $\pi$. The unit selector 1712 controls each switch of the first switch bank 1817 and the second switch bank 1818, to select output units through which the radio-frequency signals are to be outputted.

The phase controller 1721 of the quadrature-phase signal amplitude and phase controller 172 causes the second switch 186 to select the radio-frequency signals having the phases of $\pi/2$ and $-\pi/2$. Further, when the most recently inputted quadrature-phase signal of the baseband signal indicates a non-negative value, the phase controller 1721 causes each of the fifth switch 1821 and the sixth switch 1822 to select the radio-frequency signal having a phase of $\pi/2$. Further, when the most recently inputted quadrature-phase signal indicates a negative value, the fifth switch 1821 and the sixth switch 1822 are each caused to select the radio-frequency signal having a phase of $-\pi/2$. The unit selector 1722 controls each switch of the third switch bank 1827 and the fourth switch bank 1828, to select output units through which radio-frequency signals are to be outputted.

As described above, the RFDAC 100 can calibrate a phase error for each radio-frequency signal of the multi-phase radio-frequency signal generator 103, so that a PSD (power spectral density), an ACLR (adjacent channel leakage power ratio), and an EVM (error vector magnitude) can be improved, and an output signal can be outputted with a high accuracy.

Second Embodiment

The present embodiment is different from the RFDAC 100 of the first embodiment in a flow of a phase error calibration process.

Figure 9:
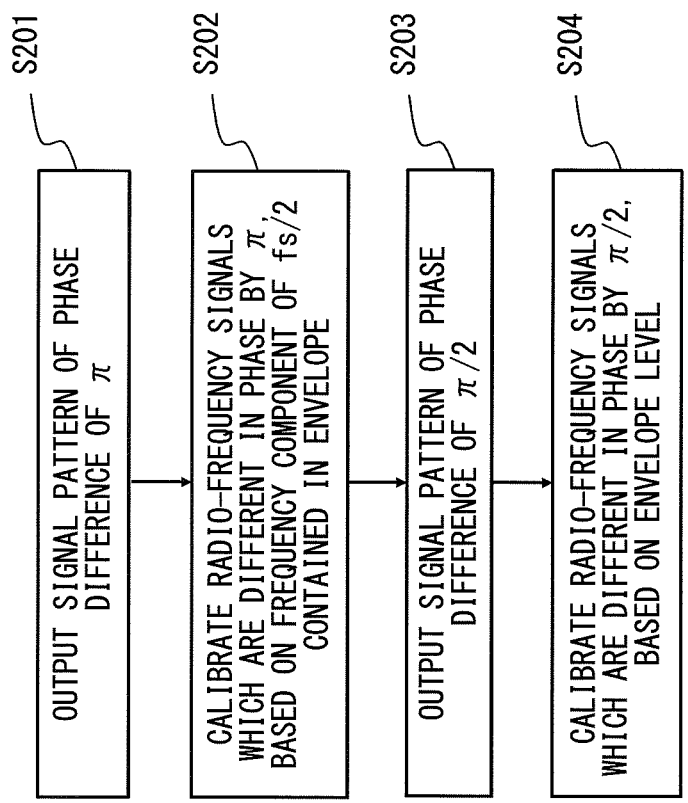
FIG. 9 illustrates a process performed by the RFDAC 100 according to a second embodiment of the present invention.

FIG. 9 shows a flow of a calibration process. Firstly, the phase controller 1711 of the in-phase signal amplitude and phase controller 171 controls the first switch 185, and the third switch 1811 and the fourth switch 1812 of the in-phase signal vector selector 181, to sequentially select two radio-frequency signals that are different in phase by $\pi$ (phases of 0 and $\pi$, and phases of $\pi/2$ and $-\pi/2$).

The unit selector 1712 causes m switches (referred to as a group a) of the first switch bank 1817 to select one of the two radio-frequency signals, causes m switches (referred to as a group b) of the second switch bank 1818 to select the other of the two radio-frequency signals, and causes the remaining switches of each switch bank to be off (step S201).

FIG. 10 shows exemplary selection patterns in which the two radio-frequency signals that are different in phase by it are selected. In step S201, two selection patterns shown in FIG. 10 are sequentially executed. The selection patterns may be patterns in which each pair of the radio-frequency signals that are different in phase by π is periodically selected.

The detector 106 detects an output signal outputted from the vector selector 180. In the selection pattern shown in FIG. 10, a frequency of a specific combination of adio-frequency signals is fs/2 when a sampling switching frequency is fs. When a phase error is contained in the specific combination of the radio-frequency signals, an envelope contains a frequency component of fs/2.

The calibrator 105 increases or decreases a calibration coefficient performed by the variable phase controllers 104, to minimize a level of the frequency component of fs/2 contained in the envelope. Thus, a phase error between two radio-frequency signals that are different in phase by π is calibrated (step S202).

Alternatively, the calibrator 105 may calculate magnitudes of phase errors $\theta_4$, and $\theta_6-\theta_2$ between the radio-frequency signals, based on the frequency component of fs/2 contained in a spectrum of the envelope, and control the variable phase controllers 104, to reduce, by $\theta_4$, a phase of the radio-frequency signal having a phase of π, and reduce, by $\theta_6-\theta_2$, a phase of the radio-frequency signal having a phase of $-\pi/2$.

The subsequent process steps (step S203 and step S204) are the same as the process steps of step S112 and step S113 of the first embodiment, and the description thereof is not given.

Also in the present embodiment, a phase error for each radio-frequency signal of the multi-phase radio-frequency signal generator 103 can be calibrated, so that a PSD (power spectral density), an ACLR (adjacent channel leakage power ratio), and an EVM (error vector magnitude) can be improved, and an output signal can be outputted with a high accuracy.

Third Embodiment

The present embodiment is different from the RFDAC 100 of the first embodiment in a flow of a phase error calibration process.

Figure 11:
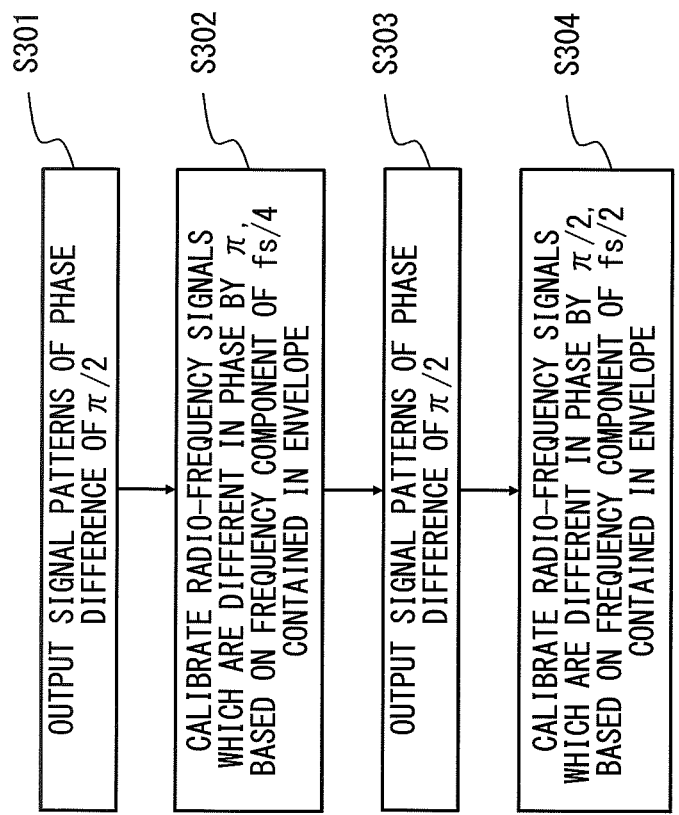
FIG. 11 illustrates a process performed by the RFDAC 100 according to a third embodiment of the present invention.

FIG. 11 shows a flow of a calibration process. Firstly, the phase controller 1711 of the in-phase signal amplitude and phase controller 171 controls the first switch 185, and the third switch 1811 and the fourth switch 1812 of the in-phase signal vector selector 181, to sequentially select two radio-frequency signals that are different in phase by π/2.

The unit selector 1712 causes m switches (referred to as a group a) of the first switch bank 1817 to select one of the two radio-frequency signals, causes m switches (referred to as a group b) of the second switch bank 1818 to select the other of the radio-frequency signals, and causes the remaining switches of each switch bank to be off (step S301).

FIG. 12 shows exemplary selection patterns in which two radio-frequency signals that are different in phase by π/2 are selected. In step S301, the selection patterns shown in FIG. 12 are executed.

The detector 106 detects an output signal outputted from the vector selector 180. In the selection pattern shown in FIG. 12, when a phase error occurs between the radio-frequency signals that are different in phase by π, an envelope contains a frequency component of fs/4. The calibrator 105 increases or decreases a calibration coefficient performed by the variable phase controllers 104, to minimize a level of the frequency component of fs/4 contained in the envelope. Thus, a phase error between the two adio-frequency signals that are different in phase by π is calibrated (step S302).

Alternatively, the calibrator 105 may calculate magnitudes of phase errors $\theta_4$, and $\theta_6-\theta_2$ between the radio-frequency signals, based on the frequency component of fs/4 contained in a spectrum of the envelope, and control the variable phase controllers 104, to reduce, by $\theta_4$, a phase of the radio-frequency single having a phase of π, and reduce, by $\theta_6-\theta_2$, a phase of the radio-frequency signal having a phase of $-\pi/2$.

Next, an output signal is outputted based on the same selection pattern (step S303). The detector 106 detects an output signal outputted from the vector selector 180. In the selection pattern shown in FIG. 10, when a phase error occurs between the radio-frequency signals that are different in phase by π/2, the envelope contains a frequency component of fs/2. The calibrator 105 increases or decreases a calibration coefficient performed by the variable phase controllers 104, to minimize a level of the frequency component of fs/2 contained in the envelope. Thus, a phase error between two radio-frequency signals that are different in phase by π/2 is calibrated (step S304).

Alternatively, the calibrator 105 may calculate magnitudes of phase errors $\theta_2$ and $\theta_6$ between the radio-frequency signals, based on the frequency component of fs/2 contained in a spectrum of the envelope, and control the variable phase controllers 104, to reduce phases of the radio-frequency signals having phases of π/2 and $-\pi/2$ by $\theta_2$ and $\theta_6$, respectively.

Also in the present embodiment, a phase error for each radio-frequency signal of the multi-phase radio-frequency signal generator 103 can be calibrated, so that a PSD (power spectral density), an ACLR (adjacent channel leakage power ratio), and an EVM (error vector magnitude) can be improved, and an output signal can be outputted with a high accuracy.

Fourth Embodiment

An RFDAC 100b of the present embodiment is different from the RFDAC 100 of the first embodiment in that radio-frequency signals having phases of 0 and π are inputted to the first switch 185, and radio-frequency signals having phases of π/2 and $-\pi/2$ are inputted to the second switch 186, in the present embodiment.

FIG. 13 shows an internal configuration of a vector controller 170 and a vector selector 180 of the RFDAC 100b. Also in the present embodiment, the phase error calibration and baseband transmission process can be performed in the same manner as in the first to the third embodiments.

In the RFDAC 100b, a set of radio-frequency signals that are different in phase by π/2 is not inputted to the in-phase signal vector selector 181 and the quadrature-phase signal vector selector 182. Therefore, in the calibration process, selection patterns in which each switch of the in-phase signal vector selector 181 and each switch of the quadrature-phase signal vector selector 182 sequentially select two radio-frequency signals that are different in phase by π/2 as shown in (a) of FIG. 6, are not used.

Therefore, as shown in (b) of FIG. 6, selection patterns in which the switches of each group sequentially select two radio-frequency signals that are different in phase by π, may be used, and the switches of the in-phase signal vector selector 181 may be used as a group a, and the switches of the quadrature-phase signal vector selector 182 may be used as a group b.

Thus, also in the present embodiment, a phase error for each radio-frequency signal of the multi-phase radio-frequency signal generator 103 can be calibrated, so that a PSD (power spectral density), an ACLR (adjacent channel leakage power ratio), and an EVM (error vector magnitude) can be improved, and an output signal can be outputted with a high accuracy.

Fifth Embodiment

Figure 14:
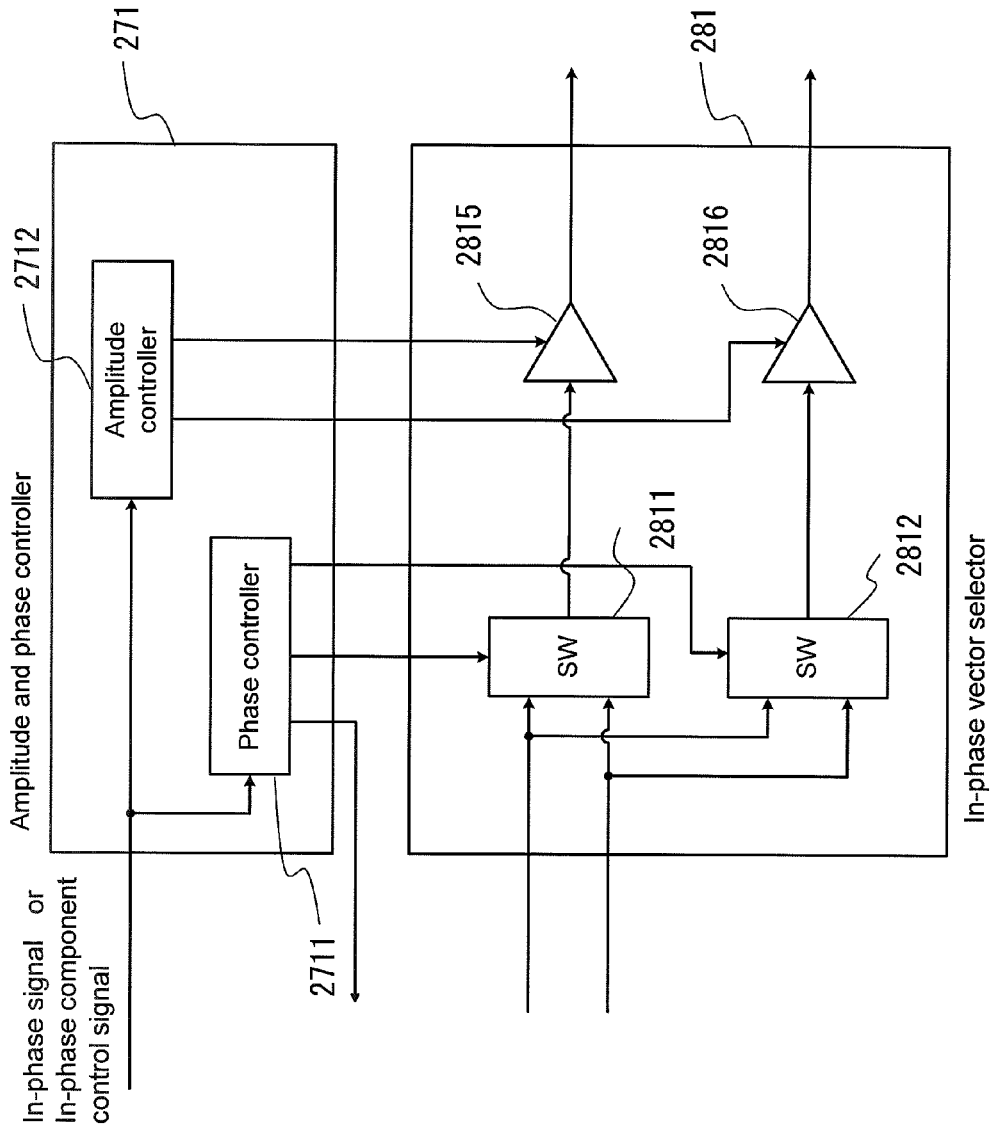
FIG. 14 illustrates a portion of the vector controller and the vector selector of the RFDAC 100 according to a fifth embodiment of the present invention.

An RFDAC 200 of the present embodiment includes the in-phase signal amplitude and phase controller 171, the in-phase signal vector selector 181, the quadrature-phase signal amplitude and phase controller 172, and the quadrature-phase signal vector selector 182 which have internal configurations different from the internal configurations of those of the RFDAC 100 of the first embodiment or the RFDAC 100b of the fourth embodiment. FIG. 14 shows an internal configuration of an in-phase signal amplitude and phase controller 271 and an in-phase signal vector selector 281 of the RFDAC 200.

The in-phase signal amplitude and phase controller 271 includes an amplitude controller 2712 instead of the unit controller 1712. The in-phase signal vector selector 281 does not include the first switch bank 1817 and the second switch bank 1818, and the output signals of a third switch 2811 and a fourth switch 2812 are directly inputted to a first amplifier 2815 and a second amplifier 2816, respectively.

The amplitude controller 2712 causes the first amplifier 2815 and the second amplifier 2816 to amplify the radio-frequency signals selected by the third switch 2811 and the fourth switch 2812, respectively, by using an amplification factor according to an amplitude of an in-phase signal.

Namely, although, in the first to the fourth embodiments, an amplitude of the signals inputted to the combiner 183 is digitally controlled by controlling the number of switches of the switch bank, an amplitude of the signals inputted to the combiner 183 is controlled in an analog manner by controlling the amplification factor of the amplifiers in the present embodiment.

An internal configuration of the quadrature-phase signal amplitude and phase controller 272 and the quadrature-phase signal vector selector 282 is the same as the internal configuration of the in-phase signal amplitude and phase controller 271 and the in-phase signal vector selector 281, and is not illustrated. The quadrature-phase signal amplitude and phase controller 272 includes an amplitude controller 2722 instead of the unit controller 1722. The quadrature-phase signal vector selector 282 does not include the third switch bank 1827 and the fourth switch bank 1828, and output signals of a fifth switch 2821 and a sixth switch 2822 are inputted to a third amplifier 2825 and a fourth amplifier 2826, respectively. The amplitude controller 2722 causes the third amplifier 2825 and the fourth amplifier 2826 to amplify the radio-frequency singles selected by the fifth switch 2821 and the sixth switch 2822, respectively, by using an amplification factor according to an amplitude of a quadrature-phase signal.

Thus, a group of the third switch 2811 and the first amplifier 2815, a group of the fourth switch 2812 and the second amplifier 2816, a group of the fifth switch 2821 and the third amplifier 2825, and a group of the sixth switch 2822 and the fourth amplifier 2826 each act as a transmission path through which a radio-frequency signal passes, to configure one output unit. Also in the present embodiment, a plurality of switches included in the vector selector 180 select from radio-frequency signals inputted to the vector selector 180, to determine output units through which the radio-frequency signals are to be outputted, namely, transmission paths through which the radio-frequency signals are to pass.

The RFDAC 200 can select and output the radio-frequency signals according to each selection pattern described in the first embodiment. Therefore, similarly to the RFDAC 100 of the first embodiment, the RFDAC 200 can calibrate a phase distortion, and improve a PSD (power spectral density), an ACLR (adjacent channel leakage power ratio), and an EVM (error vector magnitude), and an output signal can be outputted with a high accuracy.

Sixth Embodiment

Figure 15:
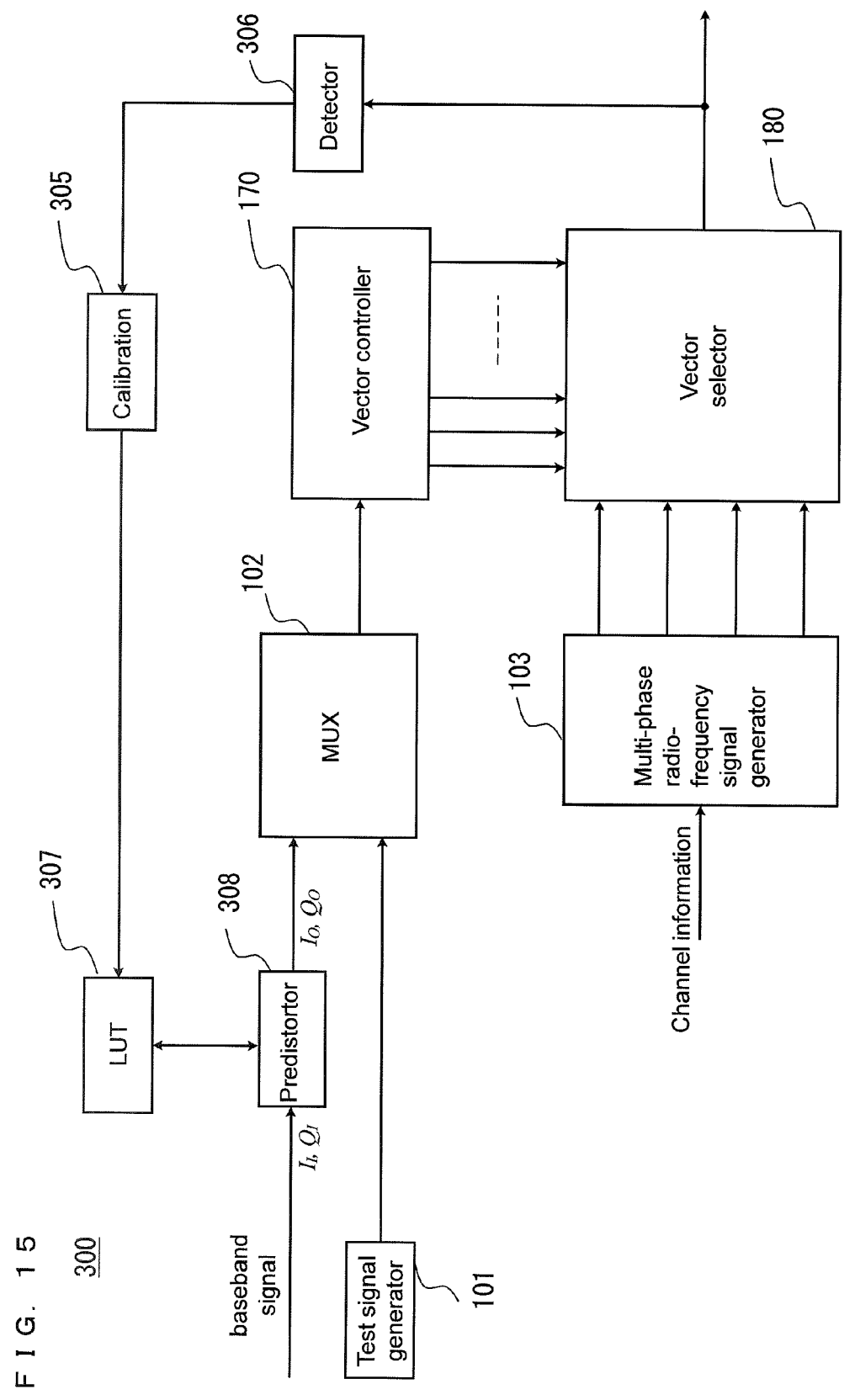

FIG. 15 shows an outline of an RFDAC 300 according to the present embodiment. The RFDAC 300 of the present embodiment is different from the RFDAC 100 of the first embodiment in that the RFDAC 300 includes a predistorter 308 and a LUT (look-up table) 307, instead of the variable phase controllers 104 being provided. Another difference between the RFDAC 300 and the RFDAC 100 is that a phase distortion of a baseband signal is calibrated by using the detector 306, the calibrator 305, and the LUT 307 in the RFDAC 300, and a phase distortion of an output signal outputted from the multi-phase radio-frequency signal generator 103 is calibrated in the RFDAC 100.

Also in the RFDAC 300 of the present embodiment, as in the RFDAC 100 of the first embodiment, phase errors $\theta_2$, $\theta_4$, and $\theta_6$ can be calculated. The calibrator 105 stores $\theta_2$, $\theta_4$, and $\theta_6$ in the LUT 307.

The predistorter 508 performs a calculation according to an equation indicated in (a) of FIG. 16, based on inputted in-phase signal $I_I$, and quadrature-phase signal $Q_I$, and values of $\theta_2$, $\theta_4$, and $\theta_6$ stored in the LUT 507, generates an in-phase signal $I_O$ and a quadrature-phase signal $Q_O$, and outputs the in-phase signal $I_O$ and the quadrature-phase signal $Q_O$ to the vector controller 170. Phase distortions of the in-phase signal $I_O$ and the quadrature-phase signal $Q_O$ are cancelled by phase distortions of output signals outputted from the multi-phase radio-frequency signal generator 103. Alternatively, the predistorter 508 may perform approximation indicated in (b) of FIG. 16 on the assumption that $\theta_2$, $\theta_4$, $\theta_6 \ll 1$ is satisfied.

As described above, the RFDAC 300 cancels, by the predistortion, the phase error for each radio-frequency signal of the multi-phase radio-frequency signal generator 103, and an output signal can be outputted with a high accuracy.

Seventh Embodiment

Figure 17:
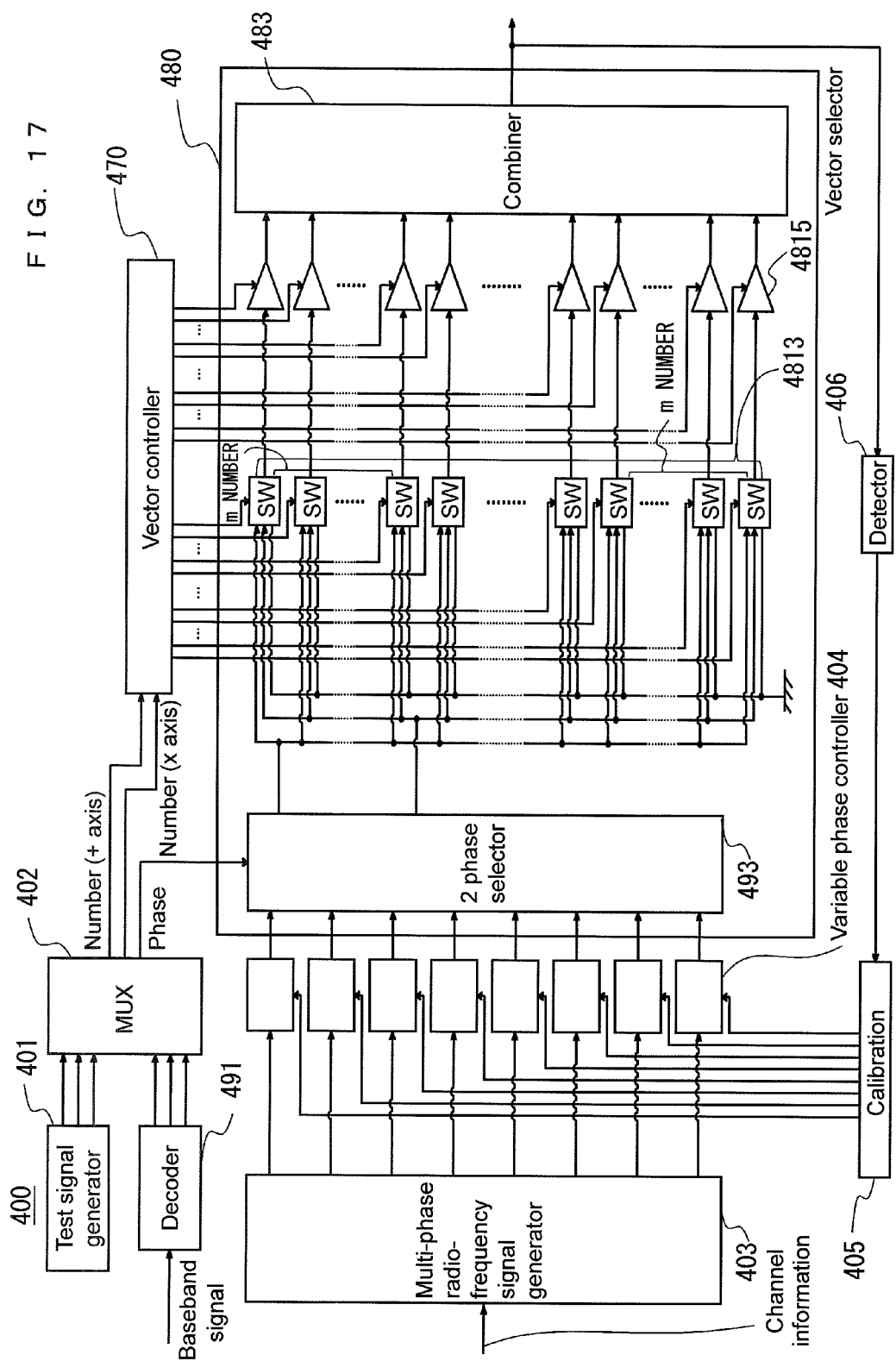
FIG. 17 illustrates an RFDAC 400 according to a seventh embodiment of the present invention.

FIG. 17 shows a configuration of an RFDAC 400 according to the present embodiment. The RFDAC 400 includes a decoder 491, a test signal generator 401, a multiplexer 402, a vector controller 470, a multi-phase radio-frequency signal generator 403, variable phase controllers 404, a calibrator 405, a detector 406, and a vector selector 480.

The decoder 491 generates and outputs a Number (+axis), a Phase (+axis), a Number (x axis), and a Phase (x axis), based on a baseband signal. A relationship between IQ-phase signals representing the baseband signal, and the Number (+axis), the Phase (+axis), the Number (x axis), and the Phase (x axis) is indicated by formulae shown in FIG. 18 and FIG. 19.

The test signal generator 401 generates and outputs a test signal in the forms of the Number (+axis), the Phase (+axis), the Number (x axis), and the Phase (x axis). The multiplexer 402 selects either the baseband signal or the test signal represented in the forms described above, and outputs the selected one. The vector controller 470 controls the vector selector 480 based on the signal outputted from the multiplexer 402.

The multi-phase radio-frequency signal generator 403 generates and outputs a plurality of radio-frequency signals having different phases. In the present embodiment, eight radio-frequency signals having phases of 0, π/2, π, −π/2, π/4, 3π/4, −π/4, and −3π/4 are outputted. A frequency of each radio-frequency signal is determined based on channel information inputted to the multi-phase radio-frequency signal generator 403. When the frequency is fixed, input of the channel information is unnecessary.

The radio-frequency signals outputted from the multi-phase radio-frequency signal generator 403 are inputted to the vector selector 480 via the variable phase controllers 404, respectively. Based on the control from the vector controller 470, the vector selector 480 selects from the inputted radio-frequency signals, and combines the selected radio-frequency signals with each other, and outputs a resultant signal.

The detector 406 detects an output signal outputted from the vector selector 480. The calibrator 405 controls each variable phase controller 404 based on the detected output signal. The variable phase controllers 404 calibrates the inputted radio-frequency signals based on the control from the calibrator 405, and output resultant signals.

Hereinafter, a configuration of the vector selector 480 will be described in detail. The vector selector 480 includes a two phase selector 493 and a switch bank 4813 having N (plural) switches, a plurality of amplifiers 4815, and a combiner 483.

The eight radio-frequency signals described above are inputted to the two phase selector 493. When the multiplexer 402 selects the baseband signal, the two phase selector 493 selects, based on the baseband signal, two radio-frequency signals corresponding to phases represented by the baseband signal. When the multiplexer 402 selects the test signal, the two phase selector 493 selects, based on the test signal, two radio-frequency signals corresponding to phases represented by the test signal.

The vector controller 470 controls, when the multiplexer 402 selects the baseband signal, each switch of the switch bank 4813 based on the baseband signal, and controls, when the multiplexer 402 selects the test signal, each switch of the switch bank 4813 based on the test signal, such that each switch selects one of the radio-frequency signals selected by the two phase selector 493, or an off state.

The vector controller 470 controls, when the baseband signal is selected, the number of switches that are to be on such that an amplitude of signals to be inputted to the combiner 483 conforms to the Number (+axis) or an amplitude represented by the Number (+axis).

Outputs of the switches of the switch bank 4813 are amplified by the amplifiers 4815, respectively. Groups of the switches of the switch bank 4813 and the amplifiers 4815 connected to the switches, respectively, act as transmission paths through which the radio-frequency signals pass, to configure one output unit. Outputs from each output unit are combined by the combiner 483, and a resultant signal is outputted as an output of the RFDAC 400.

Further, the RFDAC 400 may include a controller for controlling the entirety of the components described above.

Operations performed by the RFDAC 400 will be described separately according to whether the multiplexer 402 selects the test signal or the baseband signal.

(Case where Test Signal is Selected)

The RFDAC 400 operates to calibrate a phase error. FIG. 20 shows a flow of the calibration process.

Firstly, the two phase selector 493 obtains a calibration coefficient between two radio-frequency signals that are different in phase by π (phases of 0 and π, phases of π/4 and −3π/4, phases of π/2 and −π/2, and phases of 3π/4 and −π/4).

Calibration coefficients $\theta_4, \theta_5-\theta_1, \theta_6-\theta_2,$ and $\theta_7-\theta_3$ for the radio-frequency signals that are different in phase by π, can be calculated for the phase errors $\theta_1, \theta_2, \theta_3, \theta_4, \theta_s, \theta_6,$ and $\theta_7$ of the radio-frequency signals having phases of π/4, π/2, 3π/4, π, −3π/4, −π/2, and −π/4, which are obtained based on the radio-frequency signal having a phase of 0, in the same manner as in process steps of step S101 to S105 in the first embodiment.

Namely, the vector controller 470 causes m switches (referred to as a group a) of the switch bank 4813 to select one of the paired radio-frequency signals that are different in phase by πE, causes other m switches (referred to as a group b) of the switch bank 4813 to select the other of the paired radio-frequency signals, and causes the remaining switches to be off.

The detector 406 obtains a calibration coefficient between the radio-frequency signals that are different in phase by π, based on an output signal from the vector selector 480 (step S401).

The calibrator 405 controls the variable phase controllers 404, to calibrate a phase error between the radio-frequency signals that are different in phase by π. Namely, phases of the radio-frequency signals having phases of π, −3π/4, −π/2, and −π/4 are reduced by $\theta_4, \theta_5-\theta_1, \theta_6-\theta_2,$ and $\theta_7-\theta_3$, respectively (step S402).

Next, the two phase selector 493 selects two radio-frequency signals (phases of 0 and π/2, phases of π/4 and 3π/4, phases of π/2 and π, and phases of 3π/4 and −3π/4) that are different in phase by π/2, and the vector controller 470 causes the m switches belonging to the group a of the switch bank 4813 to select one of the two radio-frequency signals, causes the m switches belonging to the group b of the switch bank 4813 to select the other of the two radio-frequency signals, and causes the remaining switches to be off (step S403).

FIG. 21 shows exemplary selection patterns in which two radio-frequency signals that are different in phase by π/2 are selected. In step S403, the two selection patterns shown in FIG. 21 are sequentially executed. The selection patterns may be patterns in which each pair of the radio-frequency signals that are different in phase by π/2 is periodically selected.

The detector 406 detects an output signal outputted from the vector selector 480. The calibrator 405 detects an envelope level of the output signal to calibrate a phase error between the two radio-frequency signals that are different in phase by π, as in the first embodiment. In the selection pattern shown in FIG. 21, when a phase error occurs between the radio-frequency signals that are different in phase by π, an envelope contains a frequency component of fs/2.

The calibrator 405 increases or decreases a calibration coefficient performed by the variable phase controllers 404, to minimize a level of the frequency component of fs/2 contained in the envelope (step S404).

Alternatively, the calibrator 405 may calculate calibration coefficients $\theta_2, \theta_6, \theta_3-\theta_1,$ and $\theta_7-\theta_5$ for phase errors, based on the frequency component of fs/2 contained in a spectrum of the envelope, and control the variable phase controllers 404 to calibrate a phase errors between the radio-frequency signals that are different in phase by π/2. Namely, phases of the radio-frequency signals having phases of π/2, −π/2, π/4, −3π/4, −π/4, and 3π/4 may be reduced by $\theta_2, \theta_2, \theta_5-\theta_1, \theta_5-\theta_1, \theta_7-\theta_3,$ and $\theta_7-\theta_3$, respectively.

Next, the two phase selector 493 selects two radio-frequency signals that are different in phase by π/4 (phases of 0 and π/4, phases of π/4 and π/2, phases of π/2 and 3π/4, phases of 3π/4 and π, phases of π and −3π/4, phases of −3π/4 and −π/2, phases of −π/2 and −π/4, and phases of −π/4 and 0), and the vector controller 470 causes the m switches belonging to the group a of the switch bank 4813 to select one of the two radio-frequency signals, causes the m switches belonging to the group b of the switch bank 4813 to select the other of the two radio-frequency signals, and causes the remaining switches to be off (step S405).

FIG. 22 shows exemplary selection patterns in which two radio-frequency signals that are different in phase by π/4 are selected. The selection patterns may be patterns in which each pair of the radio-frequency signals that are different in phase by π/4 is periodically selected.

The detector 406 detects an output signal outputted from the vector selector 480. The calibrator 405 detects an envelope level of the output signal to calibrate a phase error between two radio-frequency signals that are different in phase by π/4. In the selection pattern shown in FIG. 22, a frequency component of fs/2 contained in a spectrum of the envelope is included. The calibrator 405 increases or decreases a calibration coefficient performed by the variable phase controllers 404 to minimize a level of the frequency component of fs/2 contained in the envelope (step S406). Alternatively, the calibrator 405 may calculate calibration coefficients $\theta_1$, $\theta_3$, $\theta_5$, and $\theta_7$, based on the frequency component of fs/2 contained in the spectrum of the envelope, and control the variable phase controllers 404, to calibrate a phase error between the radio-frequency signals that are different in phase by π/4. Namely, phases of the radio-frequency signals having phases of π/4, −3π/4, 3π/4, and −π/4 may be reduced by $\theta_1$, $\theta_1$, $\theta_3$, and $\theta_3$, respectively.

FIG. 23 shows an output signal, an envelope of the output signal, and a spectrum of the square of the envelope which are obtained when the selection pattern shown in FIG. 22 is executed in a state where: no phase error occurs in the radio-frequency signals outputted by the multi-phase radio-frequency signal generator 403; the switches belonging to the group a indicate an amplitude error of +5% and a phase error of +5%; and the switches belonging to the group b indicate an amplitude error of −5% and a phase error of −5%. The error in each switch causes dispersion in spectrum of the output signal. However, no dispersion occurs in the envelope and the square of the envelope.

(a) of FIG. 24 shows a spectrum obtained when a phase error of 3° (degree) occurs in the radio-frequency signals that have phases of π/4, 3π/4, −3π/4, and −π/4, and that are outputted from the multi-phase radio-frequency signal generator 403, in the configuration shown in FIG. 17. (b) of FIG. 24 shows phase errors of the radio-frequency signals having phases of π/4, 3π/4, −3π/4, and −π/4, by using an IQ plane. Errors in the radio-frequency signals outputted by the multi-phase radio-frequency signal generator 403 cause dispersion in the envelope and the square of the envelope.

In the selection pattern shown in FIG. 22, a frequency of a specific combination of radio-frequency signals is fs/8 when a sampling switching frequency is fs. When a phase error is contained in the specific combination of the radio-frequency signals, an envelope contains a frequency component of fs/2.

Therefore, a phase error between the radio-frequency signals that are different in phase by π/4 can be calibrated based on the spectrum of the envelope in the same manner as is used for the phase error between radio-frequency signals that are different in phase by π or π/2 as described in the first embodiment Alternatively, a calibration coefficient performed by the variable phase controllers 404 may be increased or decreased to minimize a level of the dispersion component of the envelope. Even when each phase error is not explicitly obtained, the phase error can be minimized.

(Case where Baseband Signal is Selected)

Figure 18:
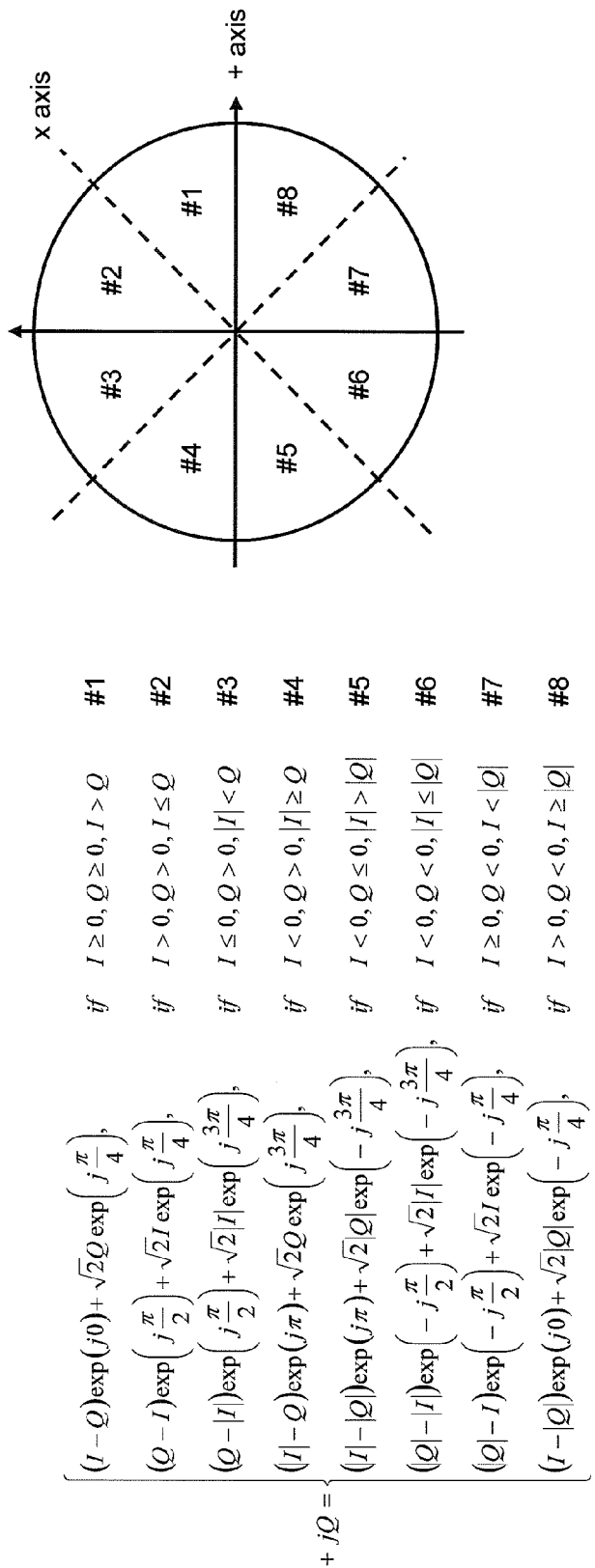
FIG. 18 illustrates a conversion process performed by the RFDAC 400 according to the seventh embodiment of the present invention.

The RFDAC 400 operates for baseband transmission. Phases of the radio-frequency signals inputted to the vector selector 480 are calibrated by the variable phase controllers 404. The vector controller 470 controls each switch of the switch bank 4813, to select output units through which the radio-frequency signals are to be outputted. The baseband signal is represented as a sum of two vectors forming an angle of π/4 as shown in FIG. 18 and FIG. 19. Therefore, a difference in phase between two radio-frequency signals that are selected by the two phase selector 493, and that are inputted to the amplifiers 4815 indicates π/4, and the difference in phase is not greater than π/4, for example, the difference in phase is not π/2. Thus, reduction in efficiency of the amplifiers 4815 can be restrained.

The RFDAC 400 can calibrate the phase error for each radio-frequency signal of the multi-phase radio-frequency signal wave generator 403, similarly to the RFDAC 100 of the first embodiment. Therefore, a PSD (power spectral density), an ACLR (adjacent channel leakage power ratio), and an EVM (error vector magnitude) can be improved, and an output signal can be outputted with a high accuracy.

Eighth Embodiment

The present embodiment is different from the RFDAC 400 of the seventh embodiment in a flow of a phase error calibration process.

Figure 25:
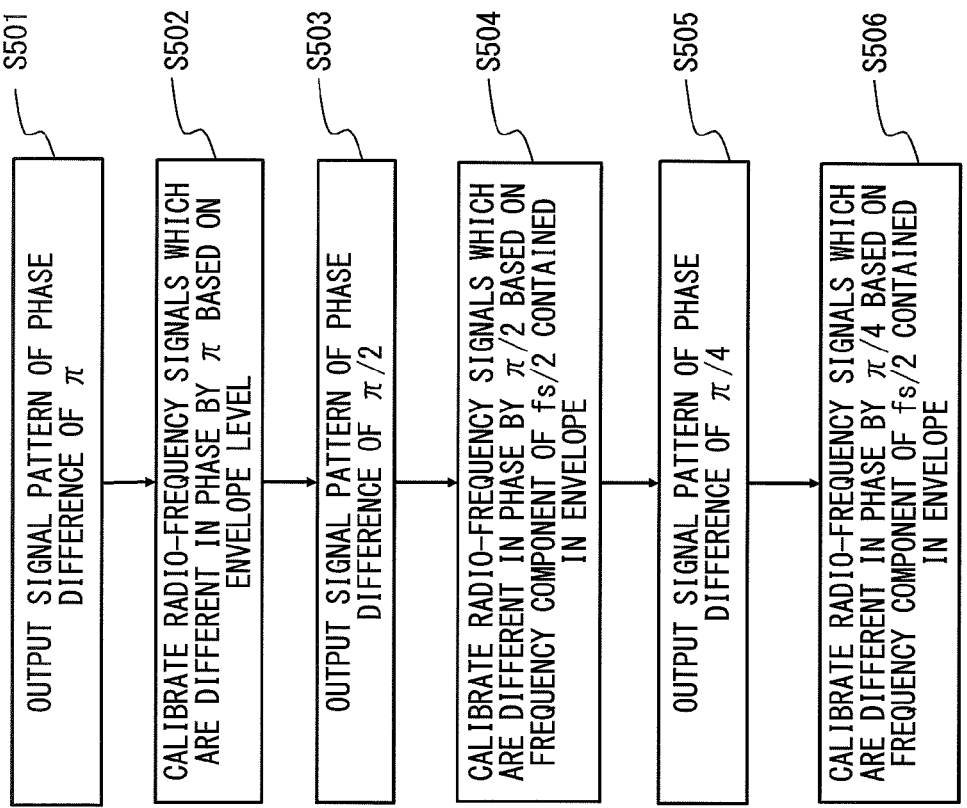
FIG. 25 illustrates a process performed by the RFDAC 400 according to an eighth embodiment of the present invention.

FIG. 25 shows a flow of the calibration process.

Firstly, the two phase selector 493 selects two radio-frequency signals that are different in phase by π (phases of 0 and π, phases of π/4 and −3π/4, phases of π/2 and −π/2, and phases of 3π/4 and −π/4), and the vector controller 470 causes m switches (referred to as a group a) of the switch bank 4813 to select one of the two radio-frequency signals, causes other m switches (referred to as a group b) to select the other of the two radio-frequency signals, and causes the remaining switches to be off (step S501).

FIG. 26 shows exemplary selection patterns in which two radio-frequency signals that are different in phase by π are selected. In step S501, four selection patterns shown in FIG. 26 are sequentially executed. The selection patterns may be patterns in which each pair of radio-frequency signals that are different in phase by it is periodically selected.

The detector 406 detects an output signal outputted from the vector selector 480. The calibrator 405 detects an envelope level of the output signal, and controls the variable phase controllers 404 based thereon, to calibrate a phase error between the radio-frequency signals that are different in phase by π (step S502).

The subsequent process steps (step S503 to step S506) are the same as the process steps of step S403 to step S406 of the seventh embodiment, and the description thereof is not given.

Also in the present embodiment, a phase error for each radio-frequency signal of the multi-phase radio-frequency signal generator 403 can be calibrated, so that a PSD (power spectral density), an ACLR (adjacent channel leakage power ratio), and an EVM (error vector magnitude) can be improved, and an output signal can be outputted with a high accuracy.

Ninth Embodiment

The present embodiment is different from the RFDAC 400 of the seventh embodiment in a flow of a phase error calibration process.

FIG. 27 shows a flow of the calibration process.

The two phase selector 493 selects two radio-frequency signals that are different in phase by π/4 (phases of 0 and π/4, phases of π/4 and π/2, phases of π/2 and 3π/4, phases of 3π/4 and π, phases of π and −3π/4, phases of −3π/4 and −π/2, phases of −π/2 and −π/4, and phases of −π/4 and 0), and the vector controller 470 causes m switches (referred to as a group a) of the switch bank 4813 to select one of the two radio-frequency signals, causes other m switches (referred to as a group b) to select the other of the two radio-frequency signals, and causes the remaining switches to be off (step S601). As selection patterns in which two radio-frequency signals that are different in phase by π/4 are selected, selection patterns shown in FIG. 22 may be used. In step S601, the selection patterns shown in FIG. 22 are executed.

The detector 406 detects an output signal outputted from the vector selector 480. In the selection pattern shown in FIG. 22, when a phase error occurs between radio-frequency signals that are different in phase by π, an envelope contains a frequency component of fs/8. Therefore, phase errors $\theta_4$, and $\theta_6 - \theta_2$ between the radio-frequency signals can be obtained based on the frequency component of fs/8 contained in a spectrum of the envelope.

Figure 28:
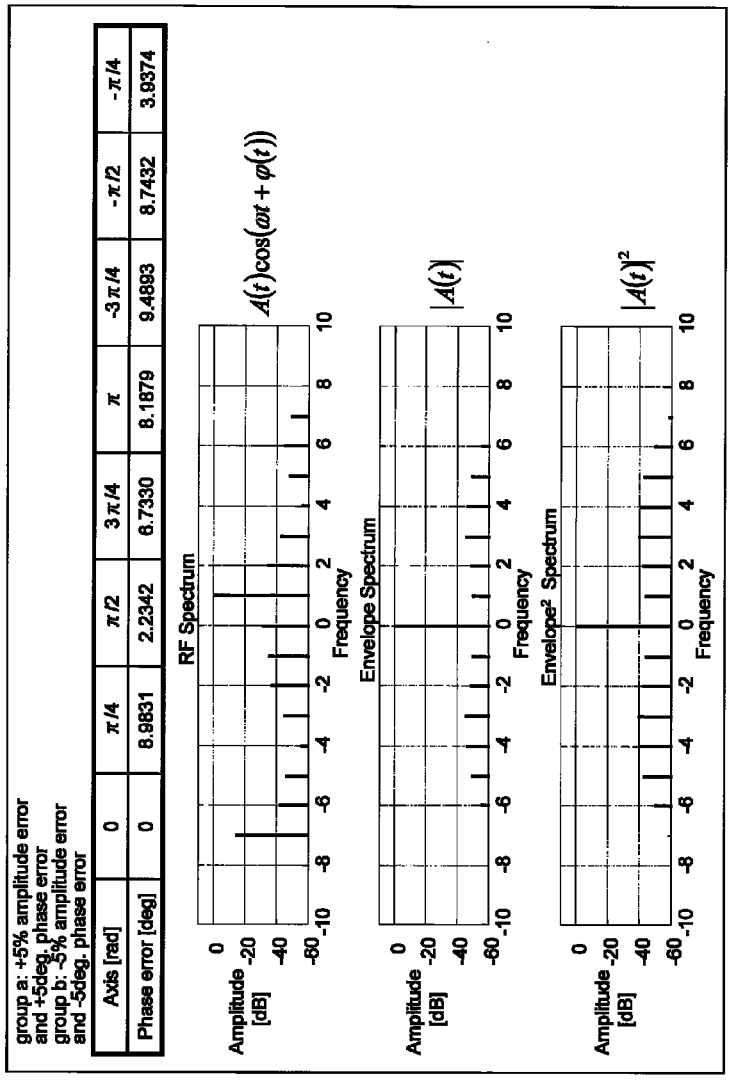
FIG. 28 illustrates exemplary spectrums of an output signal of the RFDAC 400 according to the ninth embodiment of the present invention.
Figure 29:
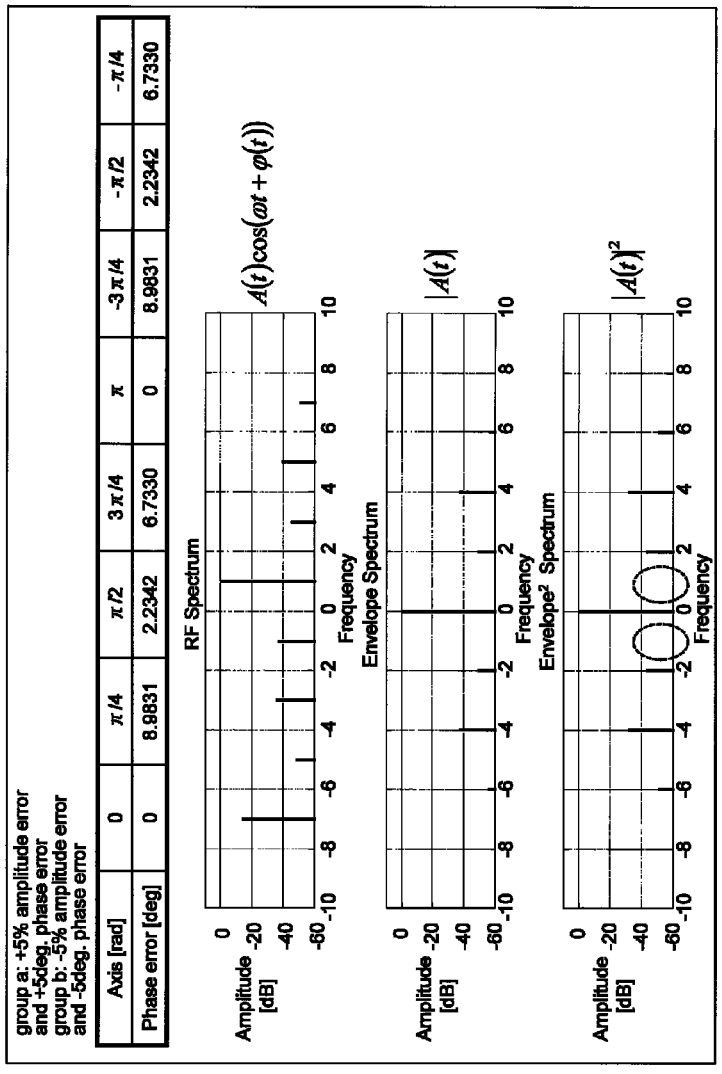
FIG. 29 illustrates exemplary spectrums of an output signal of the RFDAC 400 according to the ninth embodiment of the present invention.

The calibrator 405 controls the variable phase controllers 404, to calibrate a phase error between the radio-frequency signals that are different in phase by π, as in the seventh embodiment (step S602). FIG. 28 and FIG. 29 show phase errors and spectrums before and after execution of the process step of step S602. By executing the process step of step S602, a phase error between the radio-frequency signals having a phase of 0 and a phase of π, and a phase error between the radio-frequency signals having a phase of π/2 and a phase of −π/2, are canceled.

Next, an output signal is outputted based on the same selection pattern (step S603). The detector 406 detects an output signal outputted from the vector selector 480. In the selection pattern shown in FIG. 22, when a phase error occurs between the radio-frequency signals that are different in phase by π/2, an envelope contains a frequency component of fs/4. Therefore, the phase errors $\theta_2$, $\theta_6$, $\theta_3 - \theta_1$, and $\theta_7 - \theta_5$ between the radio-frequency signals can be calculated by using the frequency component of fs/4 contained in a spectrum of the envelope.

Figure 30:
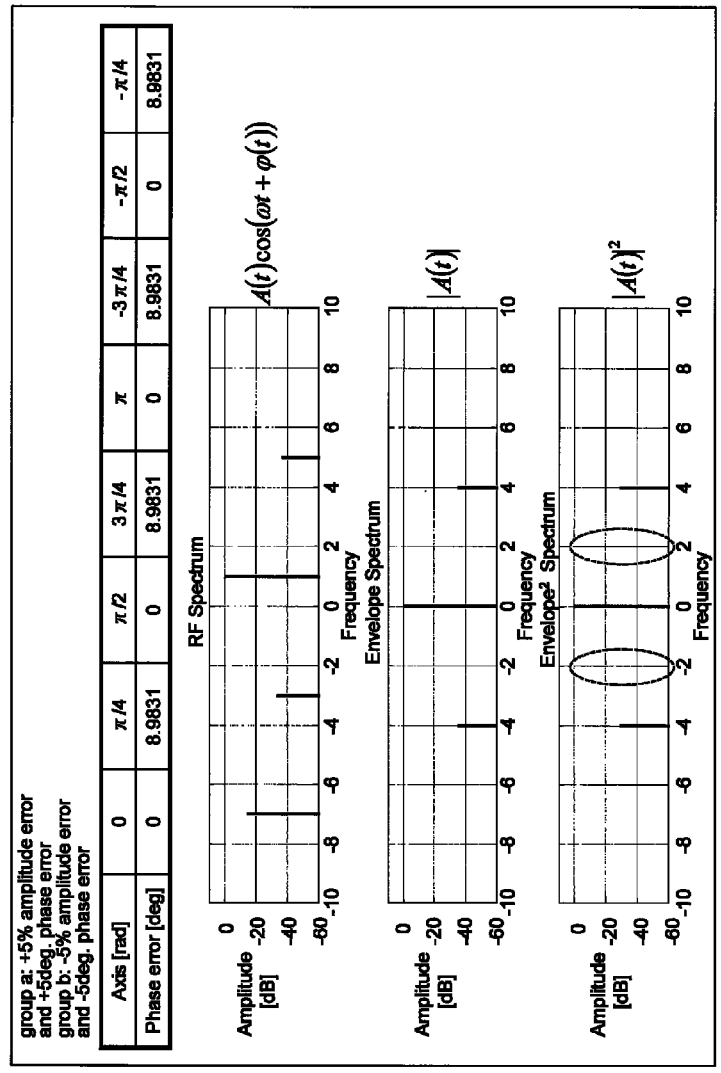
FIG. 30 illustrates exemplary spectrums of an output signal of the RFDAC 400 according to the ninth embodiment of the present invention.

The calibrator 105 calibrates a phase error between the radio-frequency signals that are different in phase by π/2, as in the seventh embodiment (step S604). FIG. 30 shows phase errors and spectrums after execution of the process step of step S604. By executing the process step of step S604, the phase errors between the radio-frequency signals that are different in phase by π/2 are canceled.

Next, an output signal is outputted based on the same selection pattern (step S605). The detector 406 detects an output signal outputted from the vector selector 480. In the selection pattern shown in FIG. 22, when a phase error occurs between the radio-frequency signals that are different in phase by π/2, an envelope contains a frequency component of fs/2. Therefore, the phase errors $\theta_1$, $\theta_3$, $\theta_5$, and $\theta_7$ between the radio-frequency signals can be calculated by using the frequency component of fs/2 contained in a spectrum of the envelope.

Figure 31:
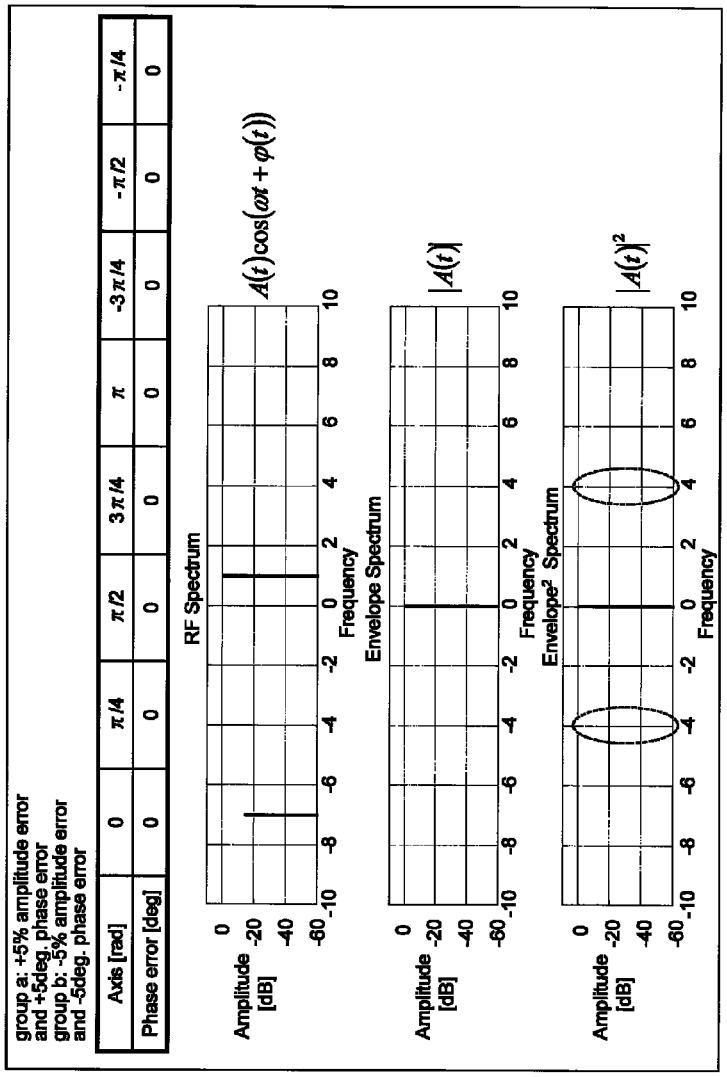
FIG. 31 illustrates exemplary spectrums of an output signal of the RFDAC 400 according to the ninth embodiment of the present invention.

The calibrator 105 calibrates a phase error between the radio-frequency signals that are different in phase by π/4, as in the seventh embodiment (step S606). FIG. 31 shows phase errors and spectrums after execution of the process step of step S606. By executing the process step of step S606, the phase errors between the radio-frequency signals that are different in phase by π14 are canceled, and the phase error eventually becomes 0 in all radio-frequency signals.

Also in the present embodiment, a phase error for each radio-frequency signal of the multi-phase radio-frequency signal generator 403 can be calibrated, so that a PSD (power spectral density), an ACLR (adjacent channel leakage power ratio), and an EVM (error vector magnitude) can be improved, and an output signal can be outputted with a high accuracy.

Tenth Embodiment

Figure 32:
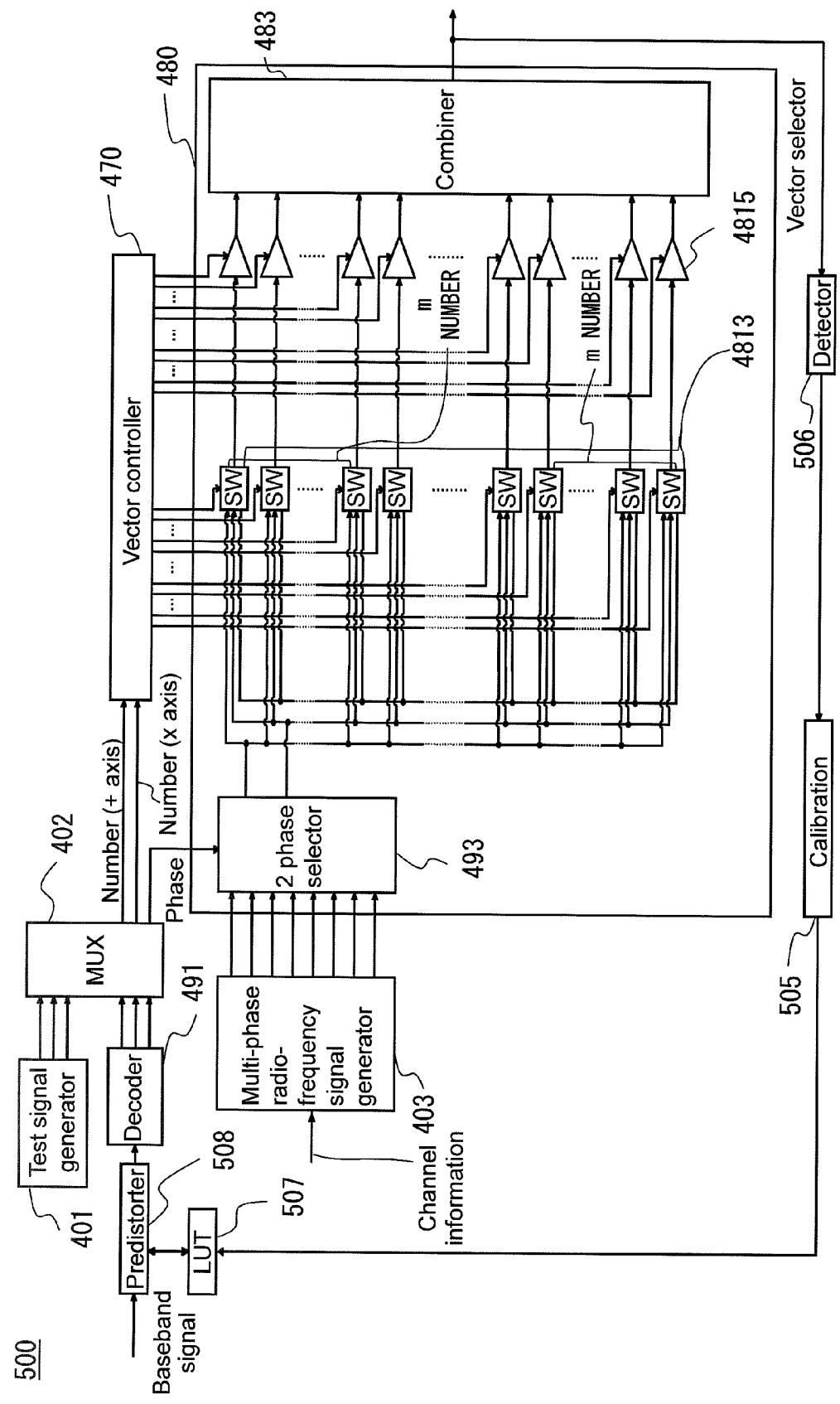
FIG. 32 illustrates an RFDAC 500 according to a tenth embodiment of the present invention.

FIG. 32 shows an outline of an RFDAC 500 according to the present embodiment. The RFDAC 500 according to the present embodiment is different from the RFDAC 400 according to the fourth embodiment in that the RFDAC 500 includes a predistortér 508, and a LUT (look-up table) 507, instead of the variable phase controllers 404 being provided. Another difference between the RFDAC 500 and the RFDAC 400 is that a phase distortion of a baseband signal is calibrated by using the detector 506, the calibrator 505, and the LUT 507 in the RFDAC 500, and a phase distortion of an output signal from the multi-phase radio-frequency signal generator 403 is calibrated in the RFDAC 400.

Also in the present embodiment, as in the fourth embodiment, each phase error can be obtained. The calibrator 505 stores phase errors $\theta_1$ to $\theta_7$ in the LUT 507. The predistorter 508 performs a calculation shown in FIG. 33, based on an inputted in-phase signal $I_I$ and quadrature-phase signal $Q_I$, and values represented by the phase errors stored in the LUT 507, generates an in-phase signal $I_O$ and a quadrature-phase signal $Q_O$, and outputs the in-phase signal $I_O$ and the quadrature-phase signal $Q_O$ to the vector controller 170.

Instead of the calculation shown in FIG. 33, an approximation shown in FIG. 34 may be performed on the assumption that the phase errors $\theta_1$ to $\theta_7$ are sufficiently small. Phase distortions of the in-phase signal $I_O$ and the quadrature-phase signal $Q_O$ are cancelled by phase distortions of output signals of the multi-phase radio-frequency signal generator 103.

As described above, the RFDAC 500 enables, by the predistortion, cancellation of the phase error for each radio-frequency signal of the multi-phase radio-frequency signal generator 403. Therefore, a PSD (power spectral density), an ACLR (adjacent channel leakage power ratio), and an EVM (error vector magnitude) can be improved, and an output signal can be outputted with a high accuracy.

In the RFDAC according to each of the embodiments described above, a frequency of a radio-frequency signal outputted by the multi-phase radio-frequency signal generator is determined based on channel information inputted to the multi-phase radio-frequency signal generator. However, when the frequency is fixed, the input of the channel information may not be performed.

The RFDAC of each of the embodiments may include a controller for controlling the entirety of the components, and a control line for connecting between the controller and each component.

Figure 35:
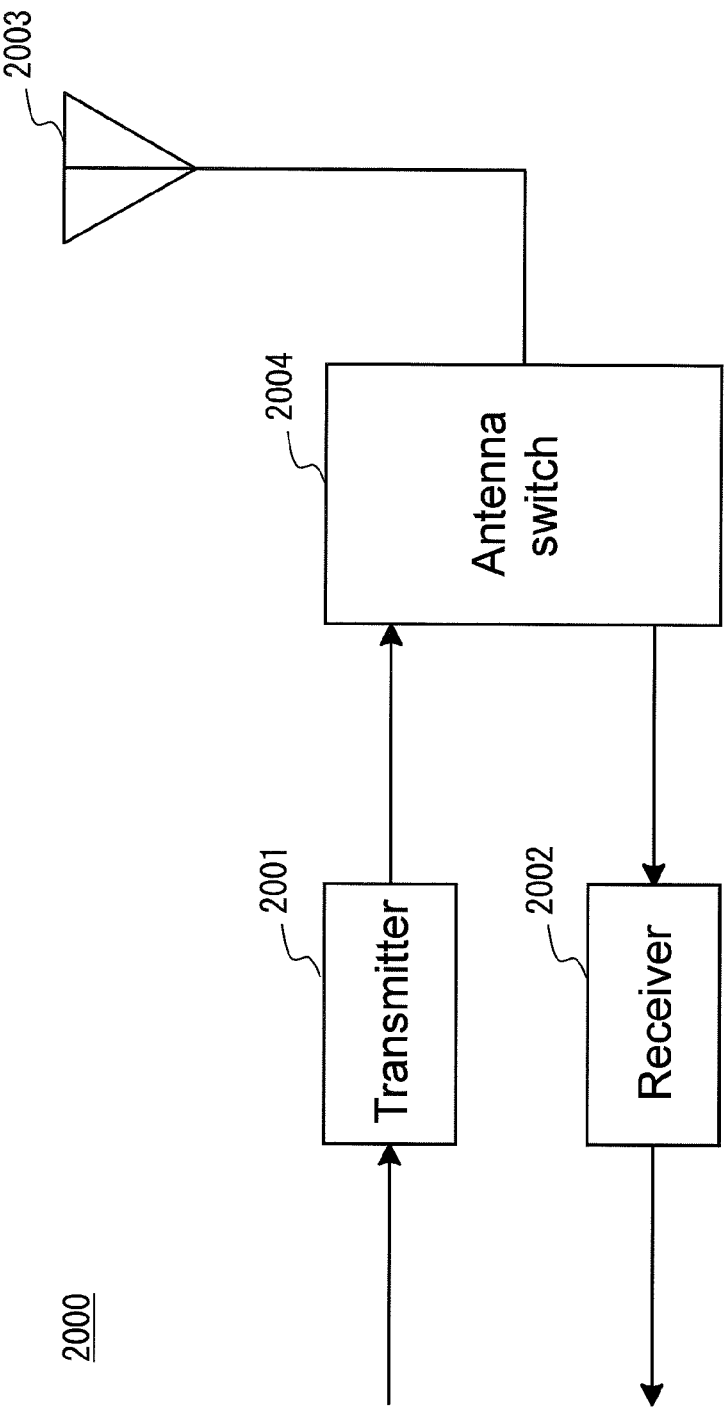
FIG. 35 illustrates a wireless communication apparatus 2000 as an exemplary application of the present invention.

The RFDAC according to the present invention as described above is applicable to wireless communication apparatuses. FIG. 35 shows a configuration of a wireless communication apparatus 2000. The wireless communication apparatus 2000 includes: a transmitter 2001 having incorporated therein the RFDAC according to any one of the embodiments of the present invention; a receiver 2002, an antenna 2003, and an antenna switch 2004 connecting thereamong. The antenna switch 2004 may be replaced with a duplexer. A calibration coefficient may be calculated when the wireless communication apparatus 2000 is powered on, or a calibration coefficient may be calculated when the wireless communication apparatus 2000 is performing a reception operation and the RFDAC 2001 need not be used for transmission, or a calibration coefficient may be calculated when the wireless communication apparatus 2000 is performing neither a transmission operation nor a reception operation.

While the invention has been described in detail, the foregoing description is in all aspects illustrative and not restrictive. It will be understood that numerous other modifications and variations can be devised without departing from the scope of the invention.

Furthermore, in the above described embodiments, examples have been described in which the present invention is formed as hardware; however, it is also possible to achieve at least one portion of the present invention as software through cooperation with hardware.

What is claimed is:

1. An RFDAC (Radio Frequency Digital to Analog Converter) for performing digital-to-analog conversion of a baseband signal, the RFDAC comprising:
    a multi-phase radio-frequency signal generator configured to generate at least four radio-frequency signals that are different in phase;
    a vector selector into which the at least four radio-frequency signals are inputted, the vector selector configured to select two radio-frequency signals from among the at least four radio-frequency signals, cause each of the two radio-frequency signals to pass through at least one transmission path, combine the two radio-frequency signals with each other, and output a combined signal;
    a test signal generator configured to generate and output a test signal;
    a multiplexer configured to select either the test signal or the baseband signal, and output the selected signal;
    a vector controller into which the signal selected by the multiplexer is inputted, the vector controller configured to control the vector selector based on the selected signal and at least one predetermined selection pattern, such that two radio-frequency signals among the at least four radio-frequency signals, and transmission paths of the two radio-frequency signals are selected;
    a detector configured to detect an output signal outputted from the vector selector; and
    a calibrator configured to calibrate a phase error between the two radio-frequency signals selected by the vector selector, based on an envelope of the output signal detected by the detector, when the multiplexer selects the test signal.

2. The RFDAC according to claim 1, wherein
    when the multiplexer selects the test signal,
        the vector selector sequentially selects the two radio-frequency signals among the at least four radio-frequency signals, and the transmission paths of the two radio-frequency signals, based on the predetermined selection pattern, and
        the calibrator calibrates a phase error between radio-frequency signals corresponding to the two phases, based on a distribution of a spectrum of an envelope in a sampling period which is determined according to the predetermined selection pattern.

3. The RFDAC according to claim 1, further comprising a variable phase controller that is connected preceding the vector selector, and configured to control phases of radio-frequency signals outputted from the multi-phase radio-frequency signal generator.

4. The RFDAC according to claim 1, further comprising
    a LUT (look-up table) configured to store a calibration coefficient of the phase error, and
    a predistorter that is connected preceding the vector controller and configured to predistort the baseband signal outputted by the multiplexer, based on the calibration coefficient stored in the LUT.

5. The RFDAC according to claim 1, wherein
    the at least four radio-frequency signals are radio-frequency signals having phases of 0, $\pi/2$, $\pi$, and $-\pi/2$,
    the baseband signal includes an in-phase signal and a quadrature-phase signal, and the test signal includes an in-phase component control signal and a quadrature-phase component control signal,
    when the multiplexer selects the test signal,
        the vector controller controls the vector selector according to the predetermined selection pattern, to sequentially select the two radio-frequency signals, and the transmission paths of the two radio-frequency signals, and
        the calibrator sequentially calibrates the phase error between the two radio-frequency signals, based on the output signal of the vector selector which is detected by the detector, and
    when the multiplexer selects the baseband signal,
        the vector controller
            controls the vector selector, and,
            among the IQ-phase signals,
                in the case of the in-phase signal indicating a non-negative value,
                    a radio-frequency signal having a phase of 0 is selected from among the radio-frequency signals, and
                in the case of the in-phase signal indicating a negative value,
                    a radio-frequency signal having a phase of $\pi$ is selected, and
                in the case of the quadrature-phase signal indicating a non-negative value,
                    a radio-frequency signal having a phase of $\pi r/2$ is further selected, and
                in the case of the quadrature-phase signal indicating a negative value,
                    a radio-frequency signal having a phase of $-\pi/2$ is further selected.

6. The RFDAC according to claim 5, wherein
    the vector controller includes an in-phase signal amplitude and phase controller and a quadrature-phase signal amplitude and phase controller,
    the vector selector includes a first switch, a second switch, an in-phase signal vector selector, a quadrature-phase signal vector selector, and a combiner,
    the in-phase signal amplitude and phase controller controls the first switch to select two radio-frequency signals from among the at least four radio-frequency signals, and controls the in-phase signal vector selector to select one of the two radio-frequency signals,
    the quadrature-phase signal amplitude and phase controller controls the second switch based on the quadrature-phase signal, to select two other radio-frequency signals from among the at least four radio-frequency signals, and controls the quadrature-phase signal vector selector to select one of the two other radio-frequency signals, and the combiner combines the radio-frequency signal outputted from the in-phase signal amplitude and phase controller, and the radio-frequency signal outputted from the quadrature-phase signal amplitude and phase controller, with each other, and outputs the combined signal.

7. The RFDAC according to claim 6, wherein
the in-phase signal vector selector includes:
a third switch and a fourth switch each of which selects one of the two radio-frequency signals selected by the first switch;
a first switch bank having a plurality of switches each of which selects either a state in which a radio-frequency signal selected by the third switch is selected, or an off-state; and
a second switch bank having a plurality of switches each of which selects either a state in which a radio-frequency signal selected by the fourth switch is selected, or an off-state, and
the in-phase signal amplitude and phase controller includes:
an in-phase signal phase controller that controls the first switch, the third switch, and the fourth switch, according to either the in-phase signal or the predetermined selection pattern; and
an in-phase signal unit selector that controls each switch of the first switch bank and each switch of the second switch bank, according to either the in-phase signal or the predetermined selection pattern.

8. The RFDAC according to claim 6, wherein
the quadrature-phase signal vector selector includes:
a fifth switch and a sixth switch each of which selects one of the two radio-frequency signals selected by the second switch;
a third switch bank having a plurality of switches each of which selects either a state in which a radio-frequency signal selected by the fifth switch is selected, or an off-state; and
a fourth switch bank having a plurality of switches each of which selects either a state in which a radio-frequency signal selected by the sixth switch is selected, or an off-state, and
the quadrature-phase signal amplitude and phase controller includes:
a quadrature-phase signal phase controller that controls the second switch, the fifth switch, and the sixth switch, according to either the quadrature-phase signal or the predetermined selection pattern; and
a quadrature-phase signal unit selector that controls each switch of the third switch bank and each switch of the fourth switch bank, according to either the quadrature-phase signal or the predetermined selection pattern.

9. The RFDAC according to claim 6, wherein
the in-phase signal vector selector includes:
a third switch and a fourth switch each of which selects one of the two radio-frequency signals selected by the first switch;
a first amplifier that amplifies a radio-frequency signal selected by the third switch; and
a second amplifier that amplifies a radio-frequency signal selected by the fourth switch, and the in-phase signal amplitude and phase controller includes:
an in-phase signal phase controller that controls the first switch, the third switch, and the fourth switch, according to either the in-phase signal or the predetermined selection pattern; and
an in-phase signal amplitude controller that controls amplification factors of the first amplifier and the second amplifier, according to either the in-phase signal or the predetermined selection pattern.

10. The RFDAC according to claim 6, wherein
the quadrature-phase signal vector selector includes:
a fifth switch and a sixth switch each of which selects one of the two radio-frequency signals selected by the second switch;
a third amplifier that amplifies a radio-frequency signal selected by the fifth switch; and
a fourth amplifier that amplifies a radio-frequency signal selected by the sixth switch, and
the quadrature-phase signal amplitude and phase controller includes:
a quadrature-phase signal phase controller that controls the second switch, the fifth switch, and the sixth switch, according to either the quadrature-phase signal or the predetermined selection pattern; and
a quadrature-phase signal amplitude controller that controls amplification factors of the third amplifier and the fourth amplifier, according to either the quadrature-phase signal or the predetermined selection pattern.

11. The RFDAC according to claim 5, wherein the at least one predetermined selection pattern includes patterns in which pairs of radio-frequency signals that are different in phase by $\pi$ are each selected periodically.

12. The RFDAC according to claim 5, wherein the at least one predetermined selection pattern includes patterns in which pairs of radio-frequency signals that are different in phase by $\pi/2$ are each selected periodically.

13. The RFDAC according to claim 1, further comprising
a decoder configured to receive the baseband signal including an in-phase signal and a quadrature-phase signal, to convert the baseband signal into a liner sum of two vectors which are included in eight vectors having directions corresponding to eight phases of $-\pi/2$, $0$, $\pi/2$, $\pi$, $-3\pi/4$, $-\pi/4$, $\pi/4$, and $3\pi/4$, which form an angle of $\pi/4$, and which have non-negative coefficients, and to output information about magnitudes and phases of the two vectors in a predetermined form, wherein
the multi-phase radio-frequency signal generator generates and outputs, as the at least four radio-frequency signals, eight radio-frequency signals having the eight phases,
when the multiplexer selects the test signal,
the vector controller controls the vector selector according to the predetermined selection pattern, to sequentially select two radio-frequency signals among the eight radio-frequency signals and transmission paths of the two radio-frequency signals, and
the calibrator sequentially calibrates a phase error between the two radio-frequency signals, based on an output signal of the vector selector which is detected by the detector, and
when the multiplexer selects the baseband signal,
the vector controller
controls the vector selector based on the information about the magnitudes and the phases of the two vectors, to select radio-frequency signals corresponding to the phases of the two vectors, from among the eight radio-frequency signals.

14. The RFDAC according to claim 13, wherein the vector selector includes:
- a two phase selector that selects two radio-frequency signals from among the eight radio-frequency signals;
- a switch bank having a plurality of switches each of which selects one of the two radio-frequency signals selected by the two phase selector, or an off-state; and
- a combiner that combines the radio-frequency signals selected by each switch of the switch bank, with each other, the multiplexer controls the two phase selector to select the phases of the two vectors among the eight radio-frequency signals, and the vector controller controls the switches of the switch bank.

15. The RFDAC according to claim 13, wherein the at least one predetermined selection pattern includes patterns in which pairs of radio-frequency signals that are different in phase by $\pi$, $\pi/2$, or $\pi/4$ are each selected periodically.

16. A wireless communication apparatus comprising:
- an antenna;
- an antenna switch connected to the antenna;
- a receiver connected to the antenna switch; and
- a transmitter, connected to the antenna switch, having incorporated therein the RFDAC according to claim 1.

* * * * *